(12) United States Patent
Ito et al.

(10) Patent No.: US 12,520,503 B2
(45) Date of Patent: Jan. 6, 2026

(54) VARIABLE RESISTANCE NON-VOLATILE MEMORY

(71) Applicant: Kioxia Corporation, Tokyo (JP)

(72) Inventors: Yuki Ito, Yokohama Kanagawa (JP); Daisaburo Takashima, Yokohama Kanagawa (JP); Hidehiro Shiga, Yokohama Kanagawa (JP); Yoshiki Kamata, Tokyo (JP)

(73) Assignee: Kioxia Corporation, Tokyo (JP)

( * ) Notice: Subject to any disclaimer, the term of this patent is extended or adjusted under 35 U.S.C. 154(b) by 405 days.

(21) Appl. No.: 18/177,064

(22) Filed: Mar. 1, 2023

(65) Prior Publication Data
US 2024/0049479 A1 Feb. 8, 2024

(30) Foreign Application Priority Data
Aug. 4, 2022 (JP) .................. 2022-124826

(51) Int. Cl.
*H10B 63/00* (2023.01)
*H10B 61/00* (2023.01)

(52) U.S. Cl.
CPC ........... *H10B 63/845* (2023.02); *H10B 61/22* (2023.02); *H10B 63/34* (2023.02)

(58) Field of Classification Search
CPC ........ H10B 63/84; H10B 63/34; H10B 63/30; H10B 63/845; H10N 70/826; H10N 70/8265
See application file for complete search history.

(56) References Cited

U.S. PATENT DOCUMENTS

| | | | |
|---|---|---|---|
| 2013/0234101 A1* | 9/2013 | Sasago | H10B 63/34 257/4 |
| 2017/0098763 A1* | 4/2017 | Tajima | H10N 70/8833 |
| 2020/0403035 A1 | 12/2020 | Ogiwara et al. | |
| 2023/0284460 A1* | 9/2023 | Chiba | G11C 13/004 365/148 |

FOREIGN PATENT DOCUMENTS

JP 2021002629 A 1/2021

* cited by examiner

*Primary Examiner* — Yu Chen
(74) *Attorney, Agent, or Firm* — Kim & Stewart LLP

(57) ABSTRACT

A variable resistance non-volatile memory includes a memory cell including a core portion extending in a first direction above a semiconductor substrate, a variable resistance layer extending in a first direction and in contact with the core portion, a semiconductor layer extending in a first direction and in contact with the variable resistance layer, an insulator layer extending in a first direction and in contact with the semiconductor layer, and a first voltage application electrode extending in a second direction crossing the first direction and in contact with the insulator layer. An impurity concentration of the semiconductor layer is non-uniform, such that an impurity concentration of a first portion of the semiconductor layer in contact with the insulator layer is at least ten times higher than an impurity concentration of a second portion of the semiconductor layer in contact with the variable resistance layer.

20 Claims, 22 Drawing Sheets

VARIABLE RESISTANCE NON-VOLATILE MEMORY

CROSS-REFERENCE TO RELATED APPLICATION

This application is based upon and claims the benefit of priority from Japanese Patent Application No. 2022-124826, filed Aug. 4, 2022, the entire contents of which are incorporated herein by reference.

FIELD

Embodiments described herein relate generally to a variable resistance non-volatile memory.

BACKGROUND

A variable resistance non-volatile memory, such as a resistive random access memory (ReRAM), an alloy type phase change memory (PCM), and an interfacial phase change memory (iPCM), in which variable resistance memory elements are integrated on a semiconductor substrate is proposed.

DETAILED DESCRIPTION

Figure 1:
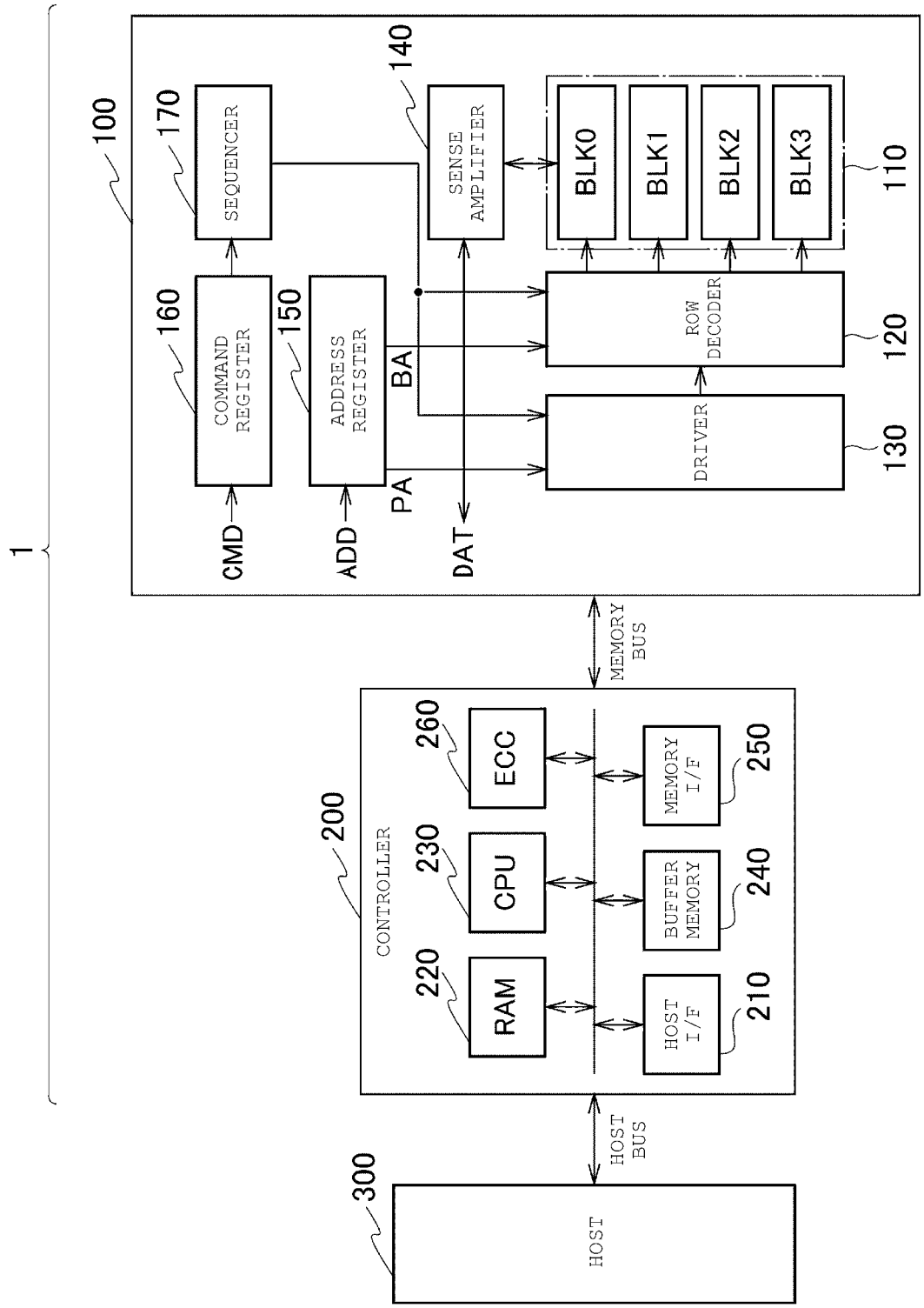
FIG. 1 is a block diagram of a memory system that include a variable resistance non-volatile memory according to an embodiment.

Embodiments provide a variable resistance non-volatile memory having a three-dimensional structure, that can expand a read margin, can be driven at a low voltage and operate at a high speed, and can suppress an increase in an adjacent cell temperature.

In general, according to one embodiment, the variable resistance non-volatile memory includes a memory cell including a core portion, a variable resistance layer, a semiconductor layer, an insulator layer, and a first voltage application electrode. The core portion extends in a first direction above a semiconductor substrate. The variable resistance layer extends in the first direction and is in contact with the core portion. The semiconductor layer extends in the first direction and is in contact with the variable resistance layer. The insulator layer extends in the first direction and is in contact with the semiconductor layer. The first voltage application electrode extends in a second direction crossing the first direction and is in contact with the insulator layer. An impurity concentration of the semiconductor layer is non-uniform, such that an impurity concentration of a first portion of the semiconductor layer in contact with the insulator layer is at least ten times higher than an impurity concentration of a second portion of the semiconductor layer in contact with the variable resistance layer.

Hereinafter, embodiments will be described with reference to the drawings. In the following description, elements having the same function and configuration are designated by a common reference numeral. In the following description, the direction perpendicular to the semiconductor substrate extending in an XY plane is a Z direction, the direction that is perpendicular to the Z direction and is the extension direction of the word line WL is an X direction, and the direction that is perpendicular to the Z direction and the X direction and is the extension direction of the bit line is a Y direction.

EMBODIMENT

Memory System

The block diagram of a memory system 1 including a variable resistance non-volatile memory according to the embodiment will be described with reference to FIG. 1. As shown in FIG. 1, the memory system 1 includes a memory chip 100 and a controller 200. The memory chip 100 and the controller 200, for example, may be combined to form one semiconductor device, and an example of the semiconductor device includes a memory card, an SSD, and the like.

The memory chip 100 includes a plurality of memory cells and stores data in a non-volatile manner. The controller 200 is connected to the memory chip 100 by a memory bus, and is connected to the host 300 by a host bus. The controller 200 controls the memory chip 100 and accesses the memory chip 100 in response to a host command received from the host 300. The host 300 is, for example, a digital camera, a personal computer, and the like, and the host bus is, for example, a bus configured according to a memory interface standard. The bus communicates signals according to the memory interface standard.

Configuration of Controller 200

As shown in FIG. 1, the controller 200 includes a host interface (host I/F) circuit 210, a built-in memory (e.g.,
random access memory (RAM)) 220, a processor (e.g., central processing unit (CPU)) 230, a buffer memory 240, a memory interface (host I/F) circuit 250, and an error checking and correcting (ECC) circuit 260.

The host interface circuit 210 is connected to the host 300 via the host bus, and transfers the host command and data received from the host 300 to the processor 230 and the buffer memory 240, respectively. Further, the host interface circuit 210 transfers the data in the buffer memory 240 to the host 300 in response to the instruction of the processor 230.

The processor 230 controls the operation of the entire controller 200. For example, when the processor 230 receives a host command from the host 300 related to reading, the processor 230 causes the memory interface circuit 250 to issue a read command (memory command) to the memory chip 100 in response to the host command. The processor 230 performs an operation in a similar manner when a host command from the host 300 related to writing is received. Further, the processor 230 also executes various processing (such as wear leveling) to manage the memory chip 100.

The memory interface circuit 250 is connected to the memory chip 100 via a memory bus and manages communications with the memory chip 100. The memory interface circuit 250 transmits various signals to the memory chip 100 based on the instruction received from the processor 230, and also receives various signals from the memory chip 100. The buffer memory 240 temporarily stores write data to be written in the memory chip 100 and read data from the memory chip 100.

The built-in memory 220 is, for example, a semiconductor memory such as DRAM or SRAM, and is used as a work area for the processor 230. The built-in memory 220 stores a firmware to manage the memory chip 100, and various management tables to be described later such as a shift table, a history table, and a flag table.

The ECC circuit 260 performs error detection and error correction processing related to data stored in memory chip 100. That is, the ECC circuit 260 generates an error correction code at the time of writing, assigns the error correction code to the write data, and decodes the error correction code at the time of reading.

Configuration of Memory Chip 100

As shown in FIG. 1, the memory chip 100 includes a memory cell array 110, a row decoder 120, a driver circuit 130, a sense amplifier 140, an address register 150, a command register 160, and a sequencer 170.

The memory cell array 110 includes a plurality of blocks BLK including a plurality of non-volatile memory cells associated with rows (of word lines) and columns (of bit lines). FIG. 1 shows four blocks BLK0 to BLK3 as an example. The memory cell array 110 stores data given by the controller 200.

The row decoder 120 selects any one of the blocks BLK0 to BLK3 based on a block address BA in the address register 150, and further selects the word line in the selected block BLK.

The driver circuit 130 supplies a voltage to the selected block BLK via the row decoder 120 based on a page address PA in the address register 150. The driver circuit 130 also includes, for example, a source line driver and the like.

The sense amplifier 140 includes a sense amplifier module SA provided for each bit line BL, senses the data read from the memory cell array 110 at the time of the read of data, and performs necessary operations. Then, data DAT is output to the controller 200. At the time of the write of data, the write data DAT received from the controller 200 is transferred by the sense amplifier module SA to the memory cell array 110.

The address register 150 stores an address ADD received from the controller 200. The address ADD includes the block address BA and the page address PA described above. The command register 160 stores a command CMD received from the controller 200. The sequencer 170 controls the operation of the entire memory chip 100 based on the command CMD stored in the command register 160.

Circuit Configuration of Memory Cell Array 110

Figure 2:
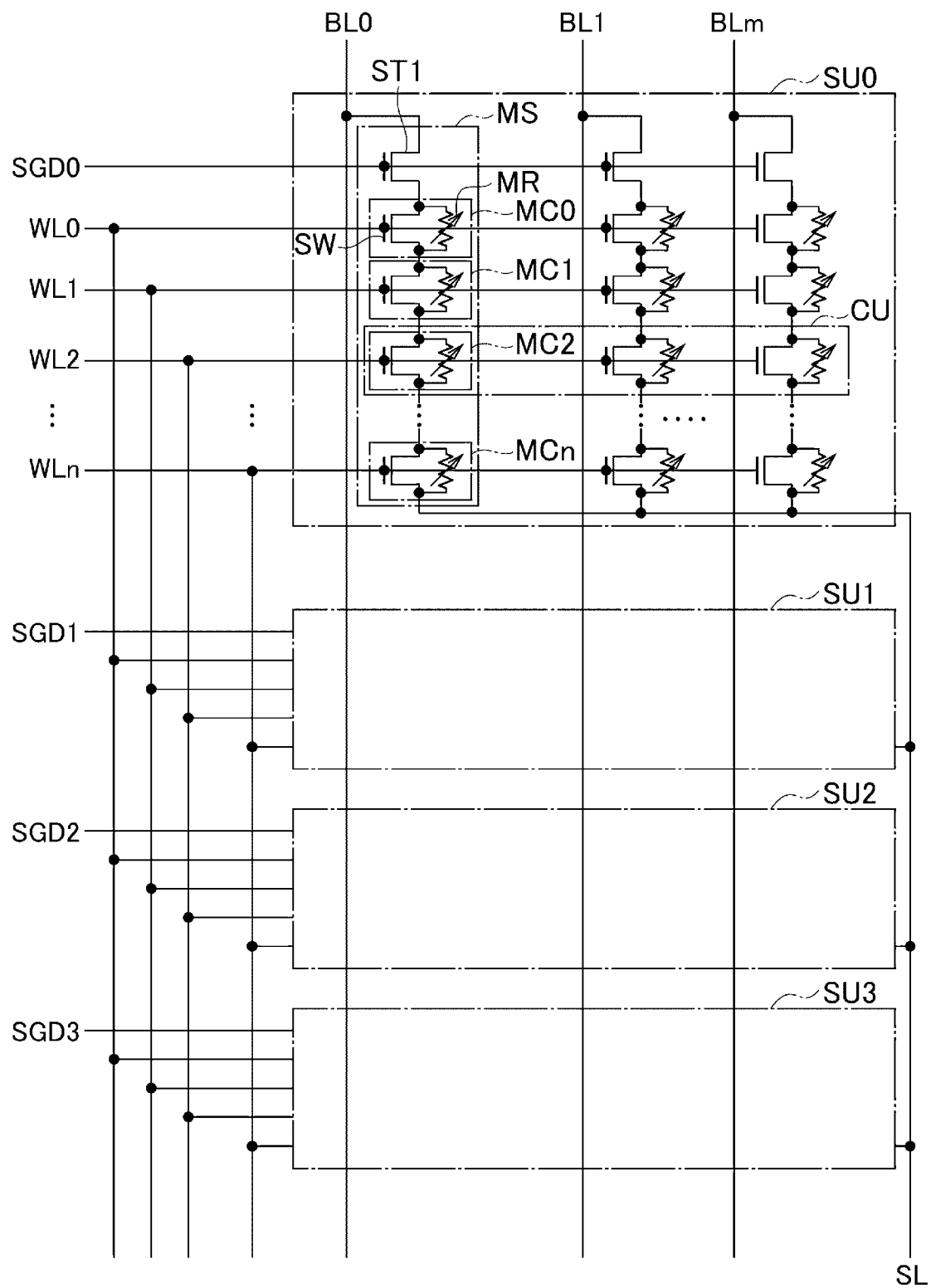
FIG. 2 is an equivalent circuit configuration diagram of a memory cell array in the variable resistance non-volatile memory of FIG. 1.

As shown in FIG. 2, the block BLK of memory cell array 110 includes, for example, four string units SU (SU0 to SU3). The number of the string units SU in the block BLK is predetermined. Further, each of the string units SU includes a plurality of memory cell strings MS.

Each of the memory cell strings MS includes, for example, n+1 memory cells MC (MC0 to MCn) (where n is a natural number equal to or greater than 1) and a select transistor ST1. Hereinafter, unless one of the memory cells MC0 to MCn is separately referred to, the memory cells MC0 to MCn will be referred to as the memory cell MC. Furthermore, the number of the select transistors ST1 provided in each of the memory cell strings MS is predetermined, and at least one is sufficient.

The memory cell MC includes a memory element (variable resistance memory area/variable resistance layer/variable resistance element) MR and a selector SW. An example of the memory element MR is an alloy type phase transition element ($Ge_2Sb_2Te_5$). The memory element MR of the first embodiment goes into a low resistance or high resistance state as the crystal state thereof changes. In the following, the change in the crystal state of the memory element MR is referred to as "phase change", a case where the memory element MR is in the low resistance state (LRS) is described as a "set state", and a case where the memory element MR is in the high resistance state (HRS) is described as a "reset state". For example, when the crystal state changes to become amorphous, the memory element MR goes into the high resistance state. When the crystal state changes and crystallizes, the memory element MR goes into the low resistance state. When the selected memory cell MC is in the high resistance state (reset state), the voltage of the bit line BL drops slowly, and when the selected memory cell MC is in the low resistance state (set state), the voltage of the bit line BL drops rapidly. Further, the selector SW of the first embodiment includes a semiconductor layer, a gate insulating film, and a gate electrode. In the memory cell MC, the memory element MR and the selector SW are connected in parallel. Further, the number of the memory cells MC provided in each of the memory cell strings MS may be 8, 32, 48, 64, 96, 128, and the like, and the number is not limited to any particular number.

When Memory Cell MC is Non-Selected

When the memory cell MC is not selected, the selector SW is in the on state (conducting state).

Figure 3:
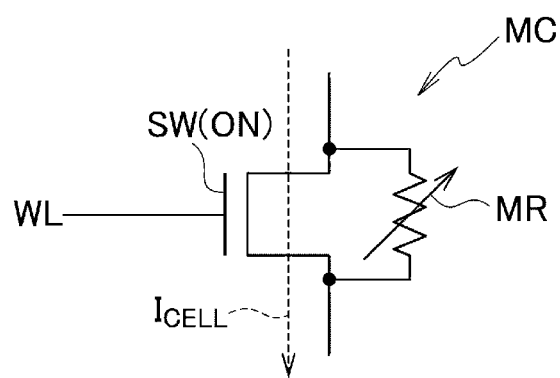
FIG. 3 is a diagram showing a current path flowing through a memory cell in the variable resistance non-volatile memory according to the embodiment, when a selector SW is in an on state.

FIG. 3 is a circuit diagram showing a current path flowing through a memory cell when the selector SW is in an on state in the variable resistance non-volatile memory according to the embodiment. As shown in FIG. 3, when the selector SW is in the on state, an inversion layer or an accumulation layer is formed in the semiconductor layer of the selector SW, such that a current flows through the inversion layer or the accumulation layer. The resistance value of the memory element MR in the low resistance state is ten times or more than the resistance value of the semiconductor layer in the on state of the selector SW. Accordingly, no current flows through the memory element MR connected in parallel. By the way, it is the memory element MR that stores data in the memory cell MC. Accordingly, the fact that no current flows through the memory element MR means that the memory cell is not selected.

When Memory Cell MC is Selected

Figure 4:
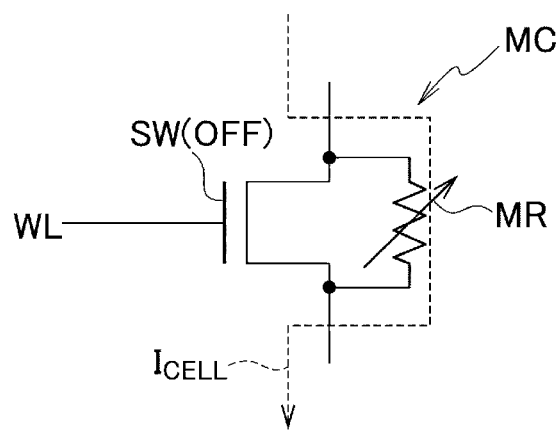
FIG. 4 is a diagram showing a current path flowing through the memory cell in the variable resistance non-volatile memory according to the embodiment, when the selector SW is in an off state.

Further, when the memory cell MC is selected, the selector SW is in the off state (non-conducting state). FIG. 4 is a circuit diagram showing a current path flowing through the memory cell when the selector SW is in the off state in the variable resistance non-volatile memory according to the embodiment. As shown in FIG. 4, when the selector SW is in the off state, the inversion layer or the accumulation layer is not formed in the semiconductor layer of the selector SW. Further, the resistance value of the memory element MR in the high resistance state is one-tenth or less than the resistance value of the semiconductor layer in the off state of the selector SW. Accordingly, the current does not flow through the semiconductor layer, but the current flows through the memory elements MR connected in parallel. The fact that the current flows through the memory element MR means that the memory cell is selected.

The memory cells MC0 to MCn provided in each of the memory cell strings MS are connected in series between the select transistor ST1 and a source line SL. The control gates of the memory cell MC0 of each of the memory cell strings MS provided in one block BLK are commonly connected to the word line WL0. Similarly, the control gates of the memory cells MC1 to MCn of the plurality of memory cell strings MS provided in one block BLK are commonly connected to the word lines WL1 to WLn, respectively. Hereinafter, unless one of the word lines WL0 to WLn is separately referred to, the word lines WL0 to WLn will be referred to as the word line WL.

Further, in the following description, a plurality of memory cells MC connected to one word line WL within each of the string units SU will be referred to as a cell unit CU. Then, a set of 1-bit data stored in a cell unit is called a "page". Accordingly, when 2-bit data is stored in the one memory cell MC, the cell unit stores data for 2 pages.

Gates of a plurality of select transistors ST1 in the string unit SU are commonly connected to a select gate line SGD. More specifically, the gates of the plurality of select transistors ST1 in the string unit SU0 are commonly connected to a select gate line SGD0. Similarly, the gates of the plurality of select transistors ST1 in the string unit SU1 are commonly connected to a select gate line SGD1. The same applies to the string units SU2 and SU3. Hereinafter, unless one of the select gate lines SGD (SGD0, SGD1, . . . ) is separately referred to, the select gate lines SGD will be referred to as the select gate line SGD. Each of select gate line SGD and word line WL is independently controlled by the row decoder 120.

Further, the drains of the select transistors ST1 of the memory cell strings MS in one column of the memory cell array 110 are commonly connected to one bit line BL (one of bit lines BL0 to BLm) (where m is a natural number of 1 or more). That is, the bit line BL commonly couples the memory cell strings MS across the plurality of blocks BLK. Furthermore, the sources of a plurality of memory cells MCn are commonly connected to the source line SL.

That is, the string unit SU includes the plurality of memory cell strings MS connected to the different bit lines BL and connected to one select gate line SGD. Further, the block BLK includes a plurality of string units SU sharing the word lines WL. The memory cell array 110 includes a plurality of blocks BLK sharing the bit lines BL.

Figure 5:
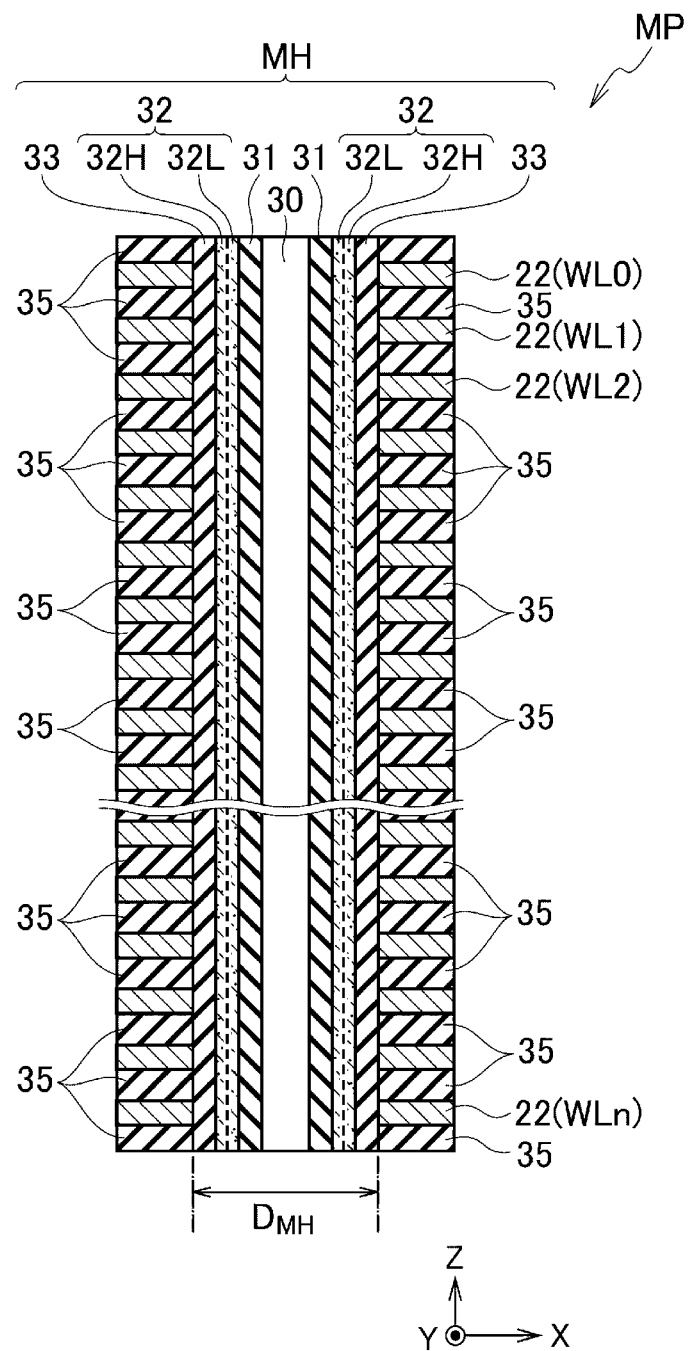
FIG. 5 is a cross-sectional view of a memory pillar in the variable resistance non-volatile memory according to the embodiment.

FIG. 5 shows an example of a cross-sectional structure of a memory pillar MP stacked three-dimensionally in the variable resistance non-volatile memory according to the embodiment. As shown in FIG. 5, the memory pillar MP includes a conductive layer 22, for example.

An insulator layer 35 and the conductive layer 22 are alternately stacked. The conductive layer 22 is formed, for example, in a plate shape extending along the XY plane. For example, a plurality of stacked conductive layers 22 are used as the word lines WLn to WL0, respectively. The conductive layer 22 contains tungsten (W), for example.

The memory pillar MP has a columnar shape extending along the Z direction and penetrates the conductive layers 22. Further, the memory pillar MP includes, for example, a core portion 30, a variable resistance layer 31, a semiconductor layer 32, and an insulator layer 33. Here, the impurity concentration of the semiconductor layer 32 is non-uniform, and a concentration distribution is present in the semiconductor layer 32. For example, the impurity concentration of the first portion of the semiconductor layer 32 that is in contact with the insulator layer 33 is at least ten times or higher than the impurity concentration of the second portion of the semiconductor layer 32 that is in contact with the variable resistance layer 31.

Further, for example, the semiconductor layer 32 includes a first semiconductor layer 32L that extends in the Z direction and is in contact with the variable resistance layer 31, and a second semiconductor layer 32H that extends in the Z direction, is in contact with the first semiconductor layer 32L, is in contact with the insulator layer 33, and has higher concentration impurities than the first semiconductor layer 32L. Here, the impurity concentration of the second semiconductor layer 32H is at least ten times or higher than the impurity concentration of the first semiconductor layer 32L.

In the following description, the semiconductor layer 32 is mainly represented as a stacked structure of the semiconductor layer 32H and the semiconductor layer 32L, but is not particularly limited to this structure. The impurity concentration of the semiconductor layer 32 is non-uniform, and a concentration distribution may be present in the semiconductor layer 32. Various impurity concentration distribution examples of the semiconductor layer 32 will be described in detail in the description of FIGS. 23 to 26.

Specifically, a memory hole MH that penetrates the stacked structure of the conductive layers 22 and the insulator layers 35 is provided. The memory hole MH has, for example, a cylindrical shape extending in the Z direction. The memory pillar MP is configured by sequentially providing the insulator layer 33, the semiconductor layer 32, the variable resistance layer 31, and the core portion 30 inside (on an inner wall) of the memory hole MH. Specifically, the memory pillar MP includes the insulator layer 33, the semiconductor layer 32, and the variable resistance layer 31. The insulator layer 33 covers the inner wall of the memory hole MH and has a cylindrical shape extending in the Z direction. The semiconductor layer 32 covers the inner wall of the insulator layer 33 and has a cylindrical shape extending in the Z direction. The variable resistance layer 31 covers the inner wall of the semiconductor layer 32 and has a cylindrical shape extending in the Z direction. A diameter $D_{MH}$ of the memory hole MH is represented as shown in FIG. 5.

Here, the core portion 30 has a columnar shape extending in the Z direction, for example. For example, $SiO_2$ may be applied to the core portion 30. Further, a material having a higher thermal resistance than $SiO_2$ may be applied. Further, vacuum or an inert gas may be applied to the core portion 30.

The degree of vacuum when the core portion 30 is evacuated may be in the range of $10^5$ Pa to $10^2$ Pa for low vacuum, $10^2$ Pa to $10^{-1}$ Pa for medium vacuum, $10^{-1}$ Pa to $10^{-5}$ Pa for high vacuum, and $10^{-5}$ Pa to $10^{-8}$ Pa for ultra high vacuum.

When the core portion 30 is made of an inert gas, for example, noble gases such as helium, neon, argon, krypton, xenon, radon, and oganesson, and nitrogen gas may be applied. The variable resistance layer 31 covers the side surface (periphery) of the core portion 30 so as to be in contact with the core portion 30. The variable resistance layer 31 extends, for example, in the Z direction and is provided in a cylindrical shape. By applying a material having a higher thermal resistance than $SiO_2$, vacuum, or an inert gas to the core portion 30, the heat generation temperature in the variable resistance layer 31 of the memory element can be increased.

The semiconductor layer 32 in the memory pillar MP covers the side surface (periphery) of the variable resistance layer 31 so as to be in contact with the variable resistance layer 31. The semiconductor layer 32 in the memory pillar MP extends, for example, in the Z direction and is provided in a cylindrical shape.

When the memory cell MC is selected, the cell current flows through the thin area of the variable resistance layer 31 in contact with the semiconductor layer 32. Consequently, the thickness of the variable resistance layer 31 may be made sufficiently thinner than the diameter of the core portion 30. By making the thickness of the variable resistance layer 31 sufficiently thinner than the diameter of the core portion 30, the current density for conducting current through the variable resistance layer 31 can be set high. As a result, it is possible to increase the heat generation temperature in the memory element, improve the locality of heat generation, and decrease disturbance (data destruction) to an adjacent memory cell.

The insulator layer 33 covers the side surface of the semiconductor layer 32. The insulator layer 33 includes, for example, a portion provided in a cylindrical shape. The insulator layer 33 contains, for example, an insulator such as silicon oxide ($SiO_2$). Further, the conductive layer 22 covers a portion of the side surface of the insulator layer 33 in the memory pillar MP so as to be in contact with the insulator layer 33.

Structure of Memory Cell Array 110

Figure 6A:
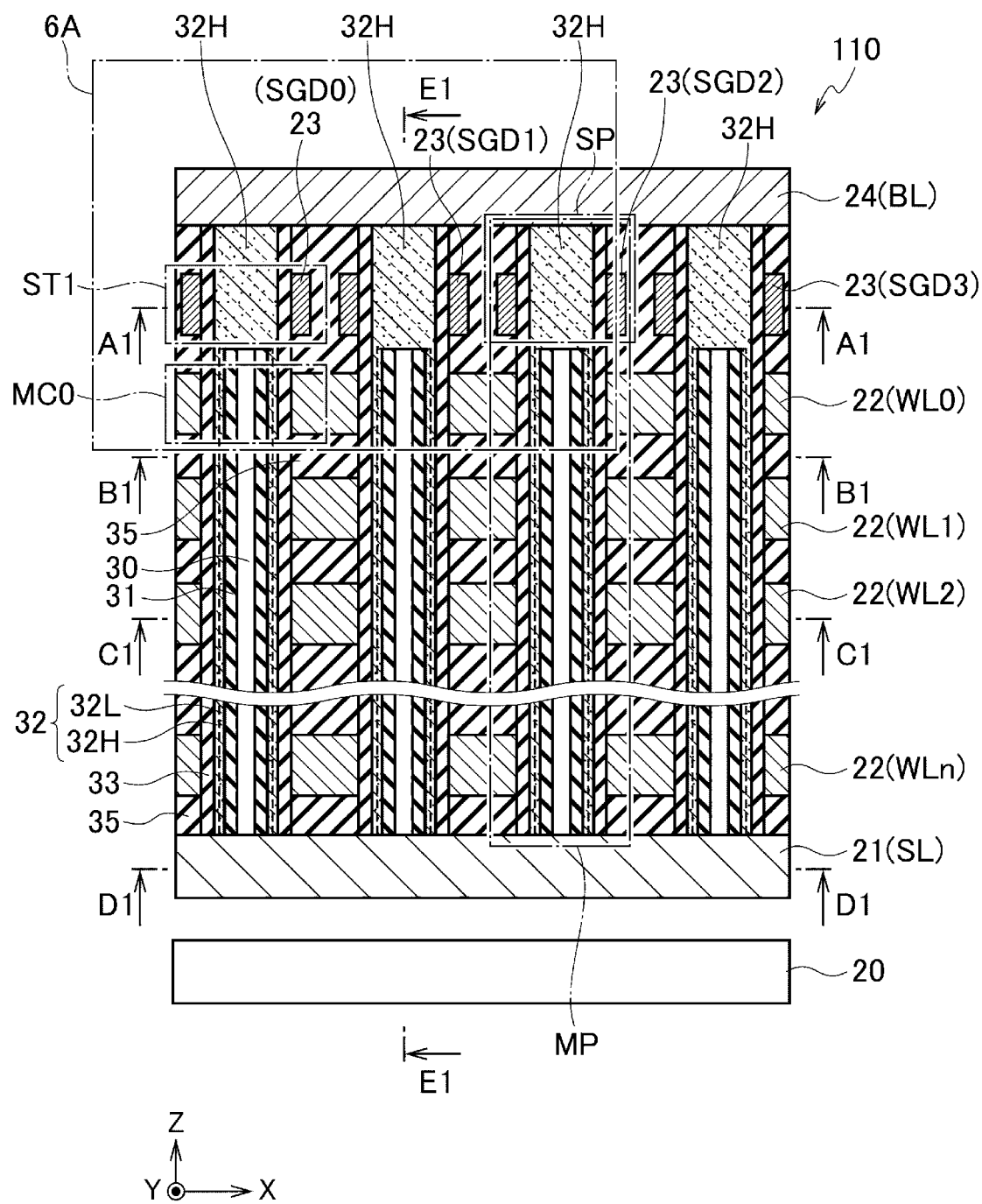
FIG. 6A is a cross-sectional view of the memory cell array in the variable resistance non-volatile memory according to the embodiment.
Figure 6B:
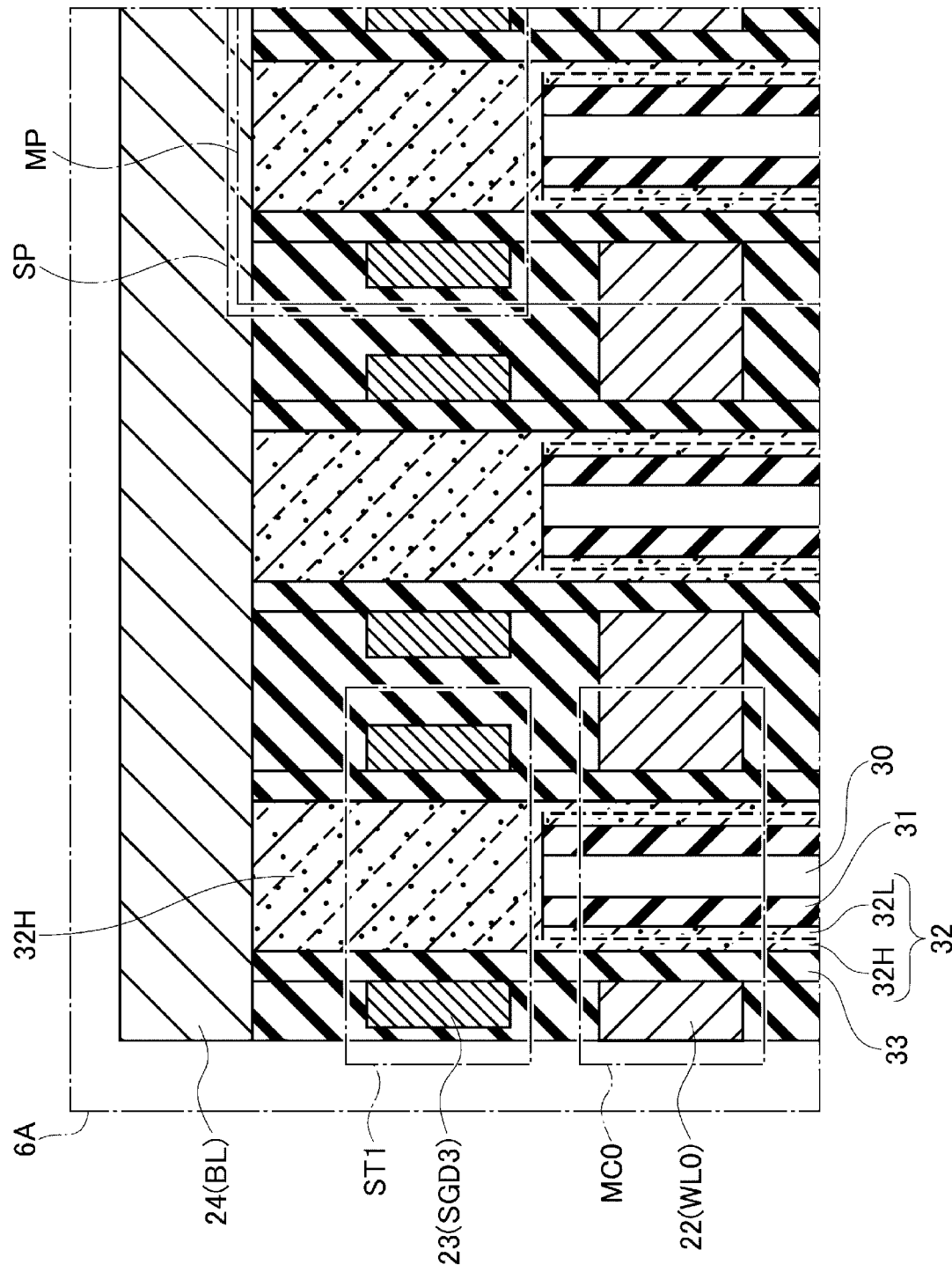
FIG. 6B is an enlarged view of area 6A portion in FIG. 6A.

An example of the cross-sectional structure of the memory cell array 110 of the variable resistance non-volatile memory according to the embodiment will be described below. FIG. 6A shows an example of the cross-sectional structure of the memory cell array 110 in the variable resistance non-volatile memory according to the embodiment. FIG. 6B is an enlarged view of area 6A portion in FIG. 6A. As shown in FIG. 6A, memory cell array 110 includes, for example, conductive layers 21 to 24. The conductive layers 21 to 24 are provided above a semiconductor substrate 20.

As shown in FIG. 6A, the variable resistance non-volatile memory according to the embodiment includes the memory cell MC including the core portion 30, the variable resistance layer 31, the semiconductor layer 32, the insulator layer 33, and the conductive layer 22. The core portion 30 extends in the Z direction perpendicular to the semiconductor substrate 20. The variable resistance layer 31 extends in the Z direction and is in contact with the core portion 30. The semiconductor layer 32 extends in the Z direction and is in contact with the variable resistance layer 31. The insulator layer 33 extends in the Z direction and is in contact with the semiconductor layer 32. The conductive layer 22 extends in the X direction perpendicular to the Z direction and is in contact with the insulator layer 33. Here, the impurity concentration of the semiconductor layer 32 is non-uniform and a concentration distribution is present. The impurity concentration of the first portion of the semiconductor layer 32 that is in contact with the insulator layer 33 is at least ten times higher than the impurity concentration of the second portion of the semiconductor layer 32 that is in contact with the variable resistance layer 31.

Further, the semiconductor layer 32 includes the first semiconductor layer 32L and the second semiconductor layer 32H, as shown in FIGS. 6A and 6B. The first semiconductor layer 32L extends in the Z direction and is in contact with the variable resistance layer 31. The second semiconductor layer 32H extends in the Z direction, is in contact with the first semiconductor layer 32L, is in contact with the insulator layer 33, and has higher concentration of impurities than the first semiconductor layer 32L. The impurity concentration of the second semiconductor layer 32H is at least ten times higher than the impurity concentration of the first semiconductor layer 32L.

Specifically, the conductive layer 21 is provided above the semiconductor substrate 20 in the Z direction with an insulator layer interposed therebetween. For example, an insulator layer between the semiconductor substrate 20 and the conductor layer 21 may be provided with a circuit such as the sense amplifier 140. The conductive layer 21 is formed, for example, in a plate shape extending along the XY plane and used as the source line SL. The conductive layer 21 contains silicon (Si), for example.

The insulator layers 35 and the conductive layers 22 are alternately stacked above the conductive layer 21 in the Z direction. Each conductive layer 22 is formed, for example, in a plate shape extending along the XY plane. For example, the plurality of stacked conductive layers 22 are used as the word lines WLn to WL0, respectively in order from the side of the semiconductor substrate 20. Each conductive layer 22 contains tungsten (W), for example.

The conductive layer 23 is stacked above the uppermost conductive layer 22 (WL0) in the Z direction with an insulator layer interposed therebetween. The conductive layer 23 extends in the Y direction and is divided in the X direction for each select pillar SP that will be described later. The divided conductive layers 23 are used as the select gate lines SGD0 to SGD3, respectively. The conductive layer 23 contains tungsten W, for example.

The conductive layer 24 is provided above the conductive layer 23 in the Z direction. For example, the conductive layer 24 is formed in a line shape extending along the X direction and used as the bit line BL. The conductive layer 24 contains copper (Cu), for example.

The select pillar SP in a columnar shape penetrating the conductive layer 23 is provided on the memory pillar MP. Further, the select pillar SP includes, for example, the semiconductor layer 32H and the insulator layer 33. Specifically, the select pillar SP is provided with an SGD hole SH that penetrates the conductive layer 23 and of which the bottom reaches the memory pillar MP, and the insulator layer 33 and the semiconductor layer 32H are provided in this order inside the SGD hole SH. The layer including the boundary between the memory hole MH and the SGD hole SH is provided in the layer between the uppermost conductive layer 22 and the conductive layer 23. The bottom portions of the core portion 30, the variable resistance layer 31, the semiconductor layer 32, and the insulator layer 33 of the memory pillar MP are in contact with the conductive layer 21.

The semiconductor layer 32H in the select pillar SP has, for example, a columnar shape. The bottom side of the semiconductor layer 32H of the select pillar SP is in contact with the semiconductor layer 32, the variable resistance layer 31, and the core portion 30 of the memory pillar MP. Further, the semiconductor layer in the select pillar SP is formed as the semiconductor layer 32H. Alternatively, depending on the manufacturing process, a stacked structure of the first semiconductor layer 32L and the second semiconductor layer 32H may be provided instead of just the second semiconductor layer 32H, similar to the semiconductor layer 32 of the memory pillar MP.

Further, the conductive layer 23 covers a portion of the side surface of the insulator layer 33 in the select pillar SP so as to be in contact with the insulator layer 33.

Figure 7:
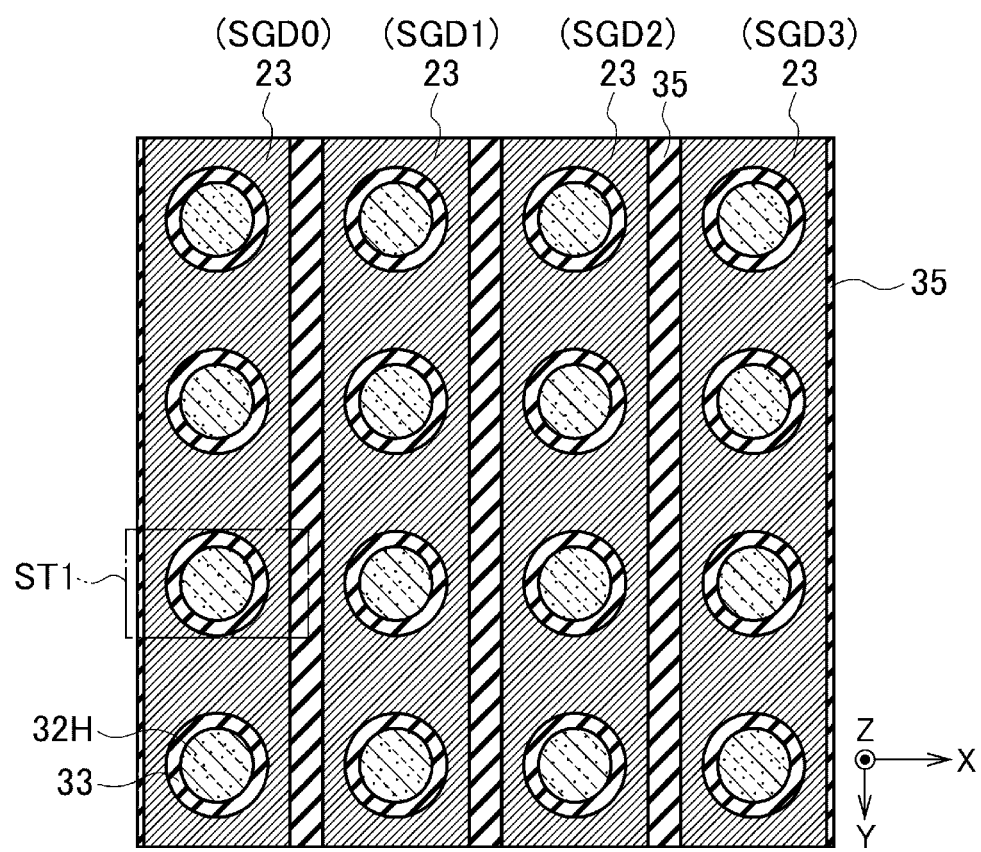
FIG. 7 is a cross-sectional view taken along line A1-A1 in FIG. 6A.

Next, the planar pattern configuration of the conductive layer 23 will be described with reference to FIG. 7. FIG. 7 is a cross-sectional view taken along line A1-A1 in FIG. 6A. As shown in FIG. 7, the insulator layer 33 and the semiconductor layer 32H are provided in the SGD hole SH penetrating the conductive layer 23. The conductive layer 23 functions as the gate lines SGD0 to SGD3 of the select transistor ST1, the insulator layer 33 functions as the gate insulating film of the select transistor ST1, and the semiconductor layer 32H functions as the semiconductor layer of the select transistor ST1. By using the select transistor ST1, the memory pillar MP can be selected for each word line. By making the select transistor ST1 to be in an on state, an inversion layer or an accumulation layer is formed in the semiconductor layer 32H in contact with the variable resistance layer 31 of the memory pillar MP, and the memory pillar MP can be selected by passing the current through the inversion layer or the accumulation layer.

Figure 8:
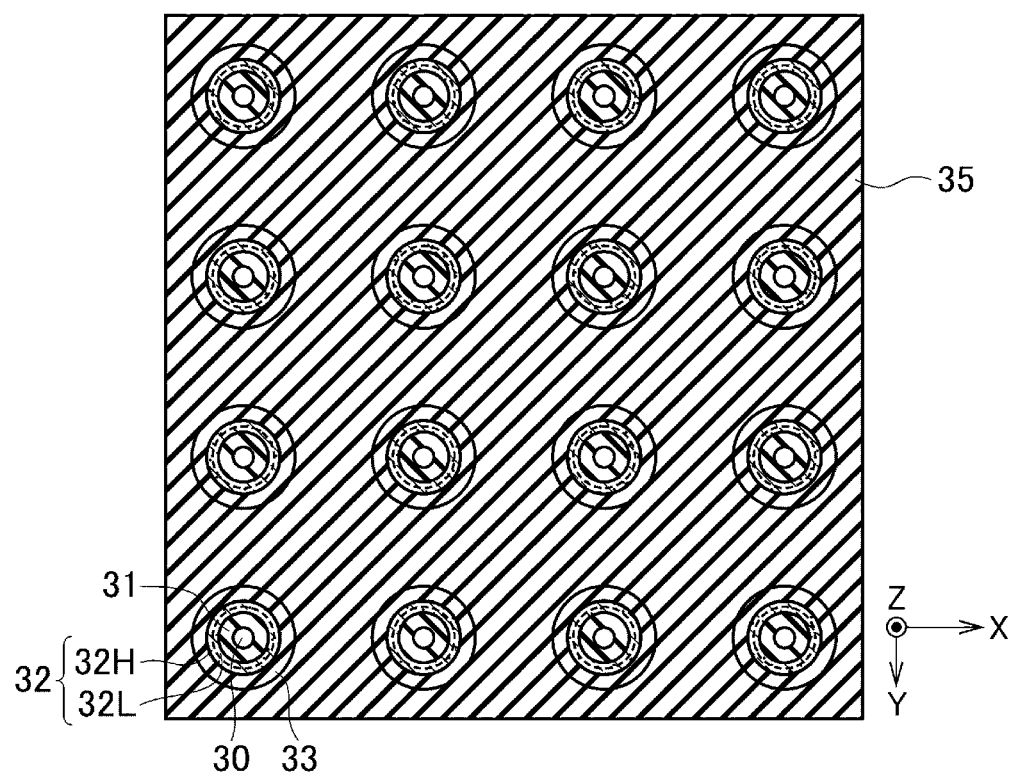
FIG. 8 is a cross-sectional view taken along line B1-B1 in FIG. 6A.

Next, a planar pattern configuration between the memory cells MC in the Z direction will be described with reference to FIG. 8. FIG. 8 is a cross-sectional view taken along line B1-B1 in FIG. 6A. The core portion 30, the variable resistance layer 31, the semiconductor layer 32, and insulator layer 33 as shown in FIG. 8 correspond to a location between the memory cells MC in the Z direction, and a current flows through the semiconductor layer 32. In FIG. 6A, the semiconductor layer 32 is shown with a stacked structure of the semiconductor layer 32H and the semiconductor layer 32L, but it is not limited to this structure.

Figure 9:
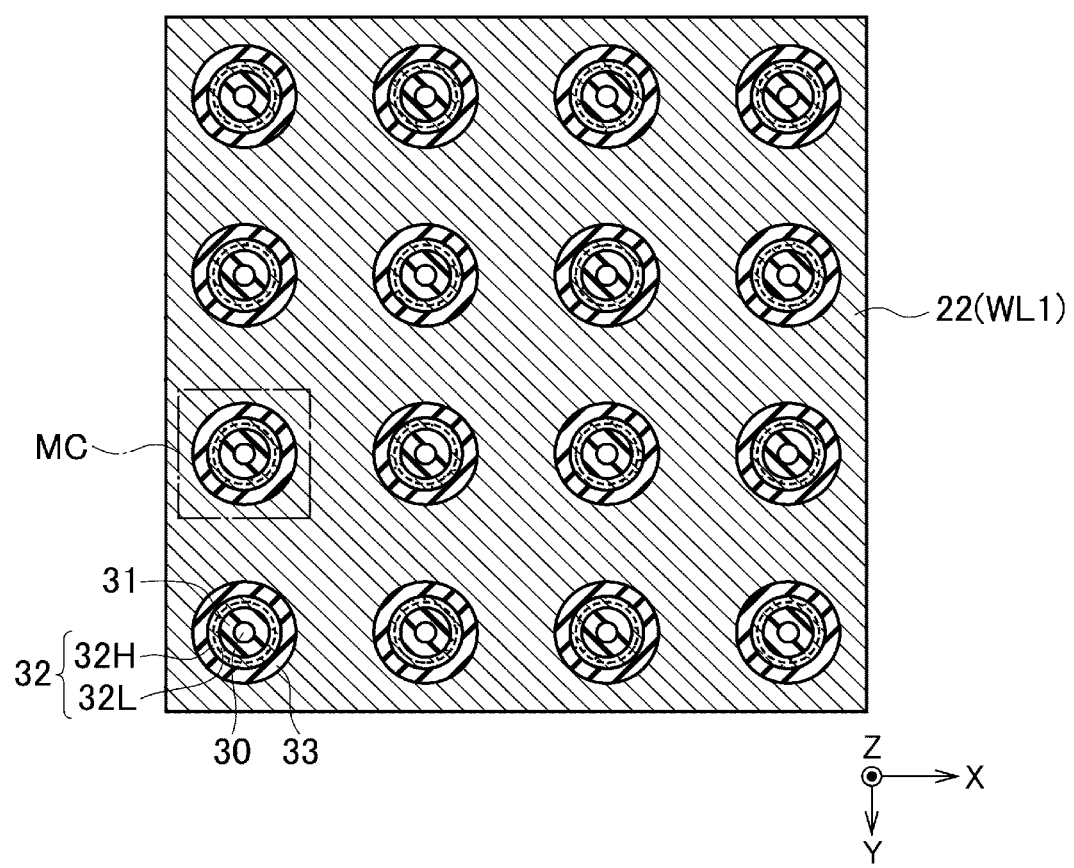
FIG. 9 is a cross-sectional view taken along line C1-C1 in FIG. 6A.
Figure 10:
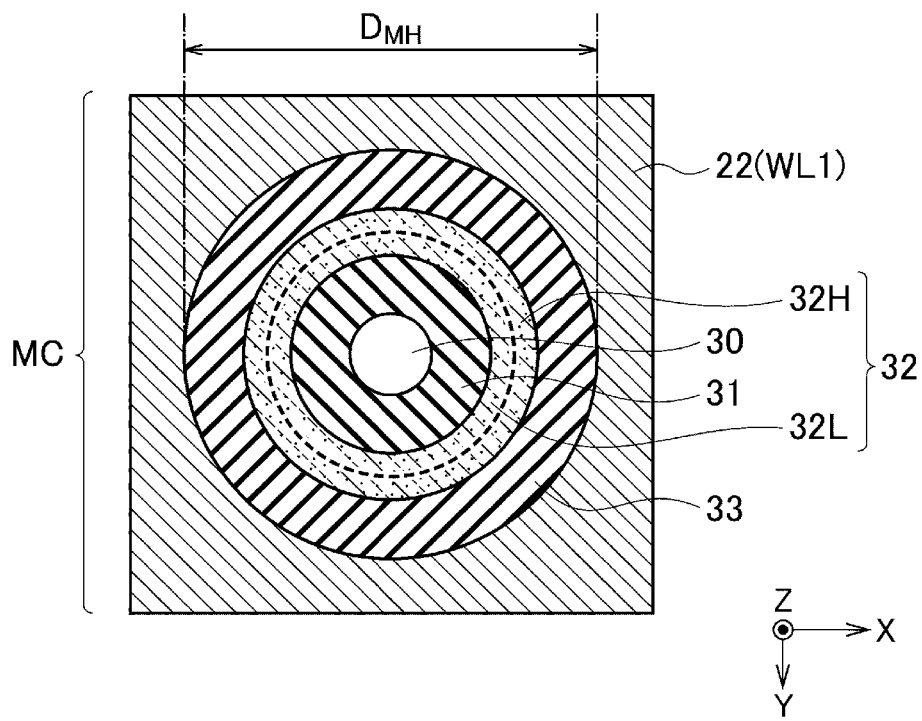
FIG. 10 is a plan view of a cross-section of the memory cell in the variable resistance non-volatile memory according to the embodiment.

Next, the planar pattern configuration of the conductive layer 22 will be described with reference to FIGS. 9 and 10. FIG. 9 is a cross-sectional view taken along line C1-C1 of FIG. 6. FIG. 10 is a plan view of a cross-section of one memory cell MC of FIG. 9. As shown in FIG. 10, the memory cell MC is provided at intersections of the word line WL and the memory pillar MP in a plate shape. Specifically, as shown in FIG. 10, the insulator layer 33, the semiconductor layer 32, the variable resistance layer 31, and the core portion 30 are provided in the memory hole MH that penetrates the conductive layer 22 and has the diameter $D_{MH}$. Then, the conductive layer 22 functions as the word line WL of the selector SW of the memory cell MC, the insulator layer 33 functions as the gate insulating film of the selector SW of the memory cell MC, and the semiconductor layer 32 functions as a semiconductor layer of the selector SW of the memory cell MC. The variable resistance layer 31 functions as the memory element MR of the memory cell MC. The semiconductor layer 32 is represented as a stacked structure of the semiconductor layer 32H and the semiconductor layer 32L, but is not particularly limited to this structure. The impurity concentration of the semiconductor layer 32 is non-uniform, and a concentration distribution may be present in the semiconductor layer 32.

Figure 11:
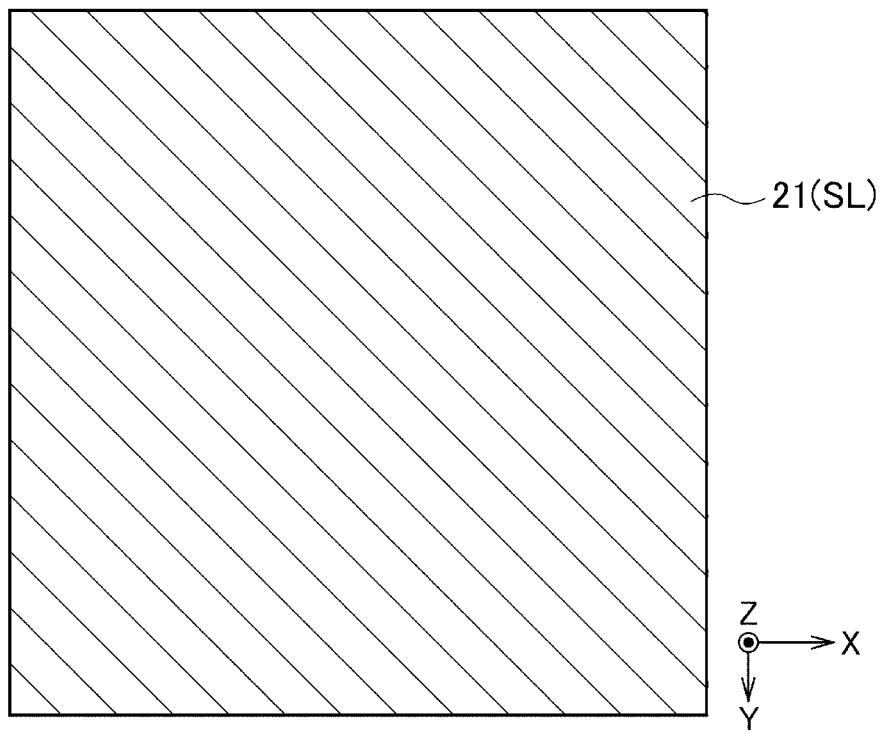
FIG. 11 is a cross-sectional view taken along line D1-D1 in FIG. 6A.

Next, the planar pattern configuration of the conductive layer 21 will be described with reference to FIG. 11. FIG. 11 is a cross-sectional view taken along line D1-D1 in FIG. 6A. The conductive layer 21 is set to a constant low voltage in order to allow a current to flow from the bit line BL. As shown in FIG. 11, the conductive layer 21 has a plate shape like the conductive layer 22.

Figure 12A:
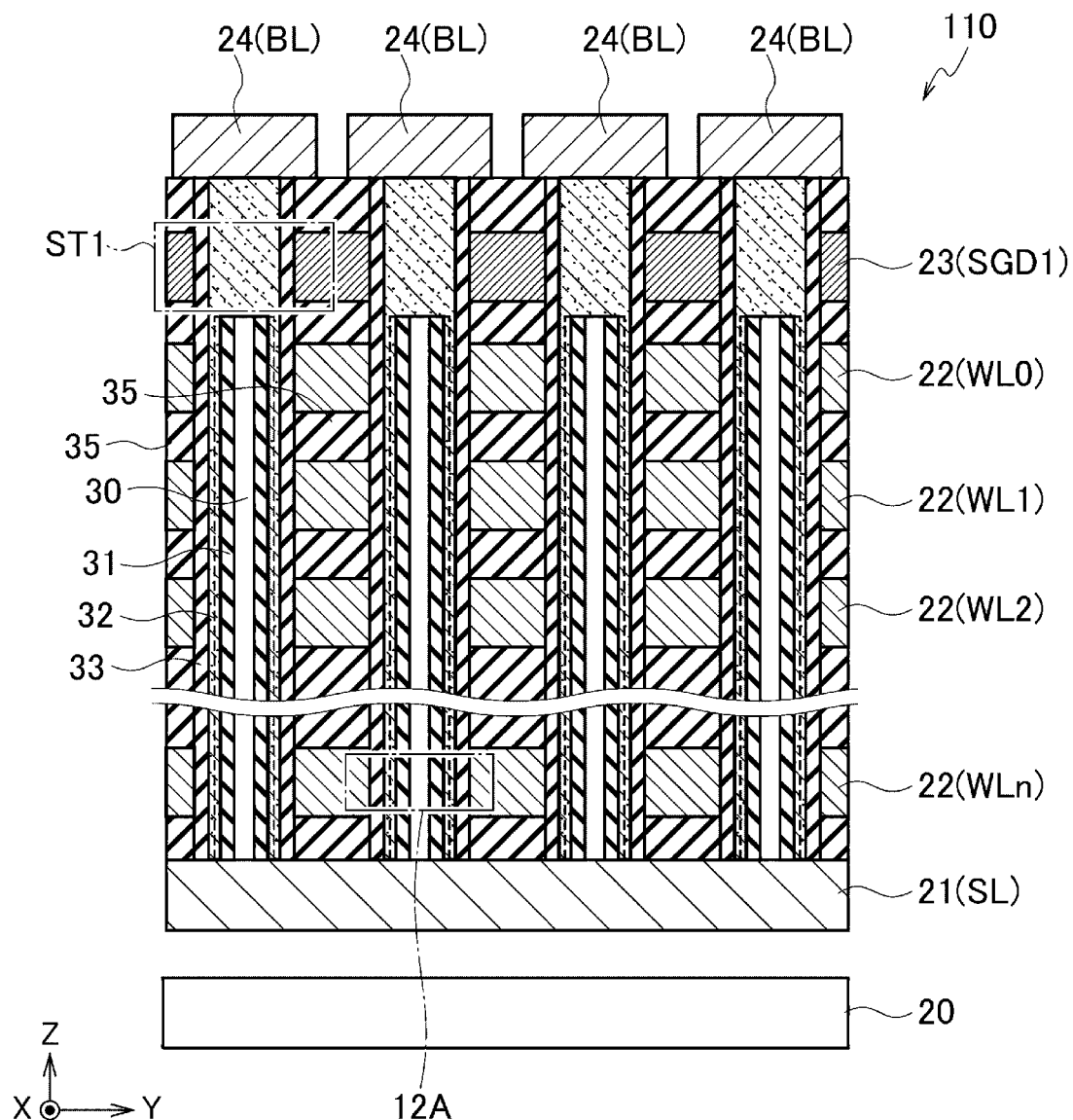
FIG. 12A is a cross-sectional view taken along line E1-E1 in FIG. 6A in a direction orthogonal to FIG. 6A.
Figure 12B:
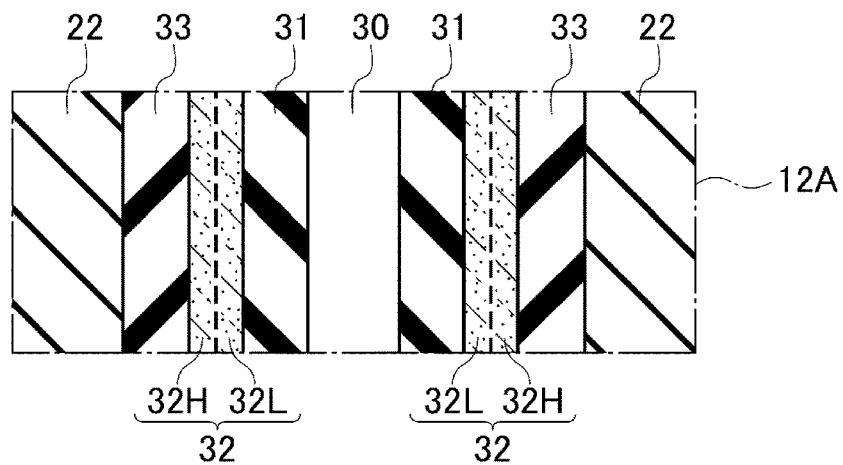
FIG. 12B is an enlarged view of area 12A portion in FIG. 12A.

Next, an example of the cross-sectional structure of the memory cell array 110 will be described with reference to FIGS. 12A and 12B. FIG. 12A is a cross-sectional view taken along line E1-E1 in FIG. 6A in a direction orthogonal to FIG. 6A. Further, FIG. 12B is an enlarged view of area 12A portion in FIG. 12A. Referring to FIG. 6A and FIG. 12A together, it can be seen that the memory pillar MP has a concentric shape with the core portion 30 as the center.

Outline of Operation

An overview of the operation of the memory chip 100 in the variable resistance non-volatile memory according to the embodiment will be described. In the variable resistance non-volatile memory according to the embodiment, the read operation and write operation of the memory chip 100 are performed by passing a current between the bit line BL and the source line SL.

Figure 13:
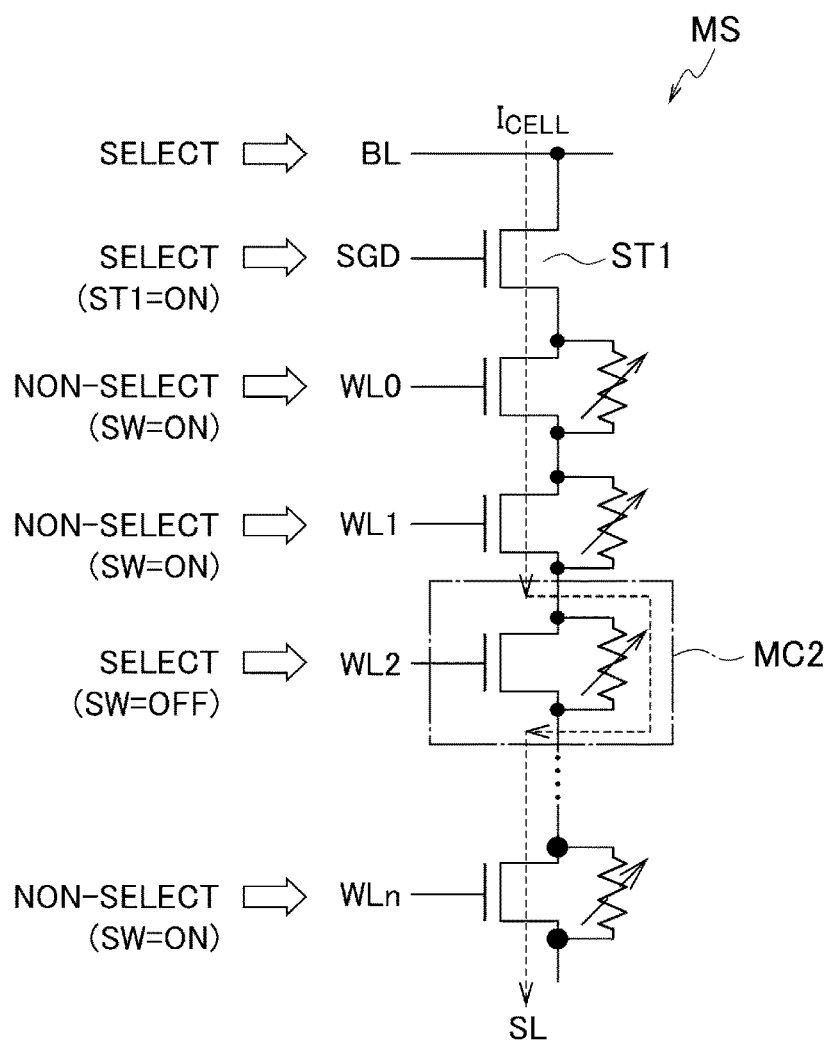
FIG. 13 is a circuit diagram of one memory cell string in the variable resistance non-volatile memory according to the embodiment.
Figure 14:
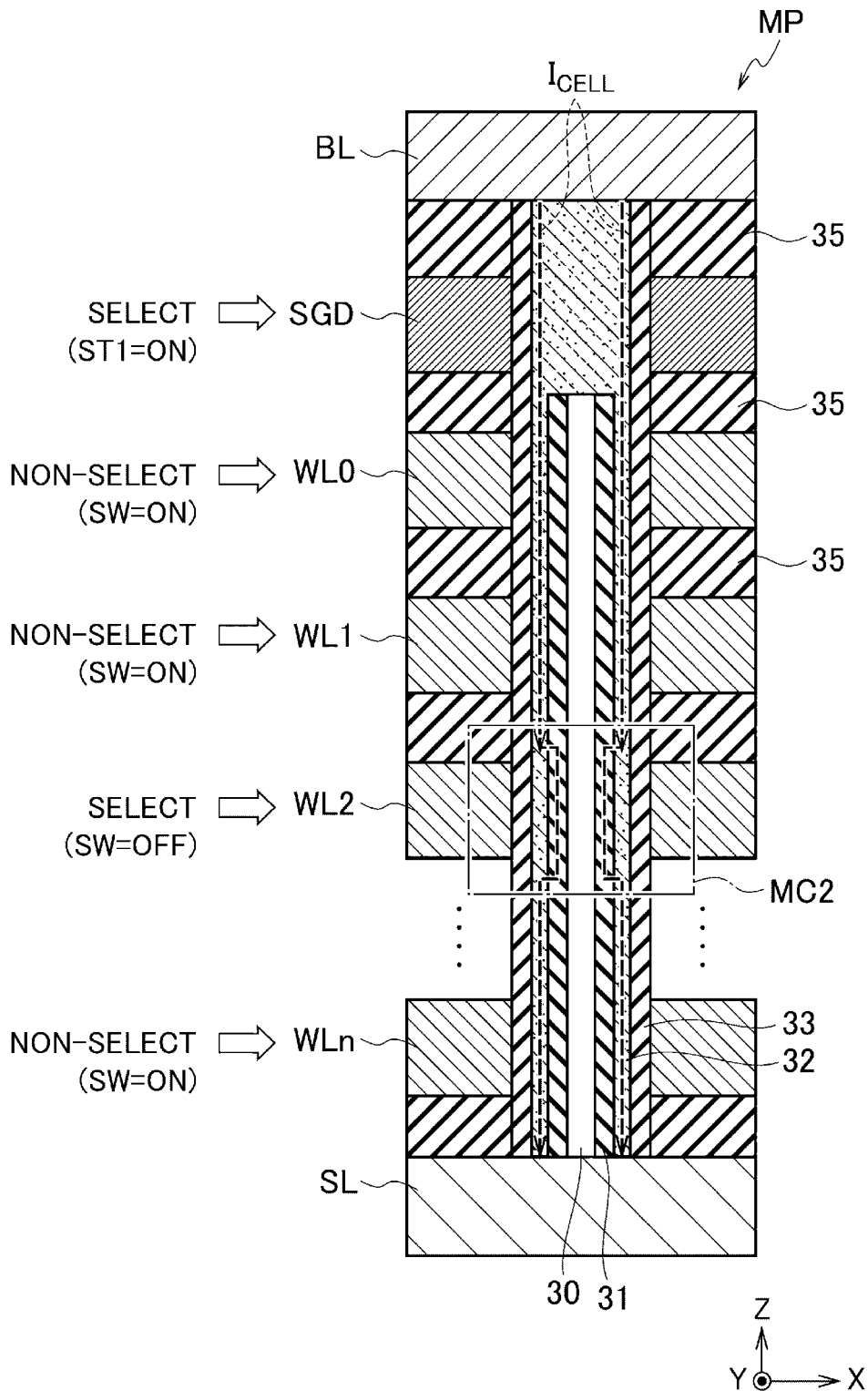
FIG. 14 is a cross-sectional view of a memory pillar corresponding to the one memory cell string in the variable resistance non-volatile memory according to the embodiment.

A method of selecting a memory cell MC that performs a read operation and a write operation will be described with reference to FIGS. 13 and 14. FIG. 13 is a circuit diagram of one memory cell string MS. FIG. 14 is a cross-sectional view of the memory pillar MP corresponding to the one memory cell string MS. Further, since FIG. 14 is a view illustrating the operation, the semiconductor layer 32 is simply indicated as the semiconductor layer 32, and the semiconductor layer 32H and the semiconductor layer 32L are not depicted.

As shown in FIGS. 13 and 14, a predetermined voltage (e.g., positive voltage) is applied to the gate line SGD of the select transistor ST1 that is in contact with the memory pillar MP to which the memory cell MC (for example, MC2) to be selected belongs. As a result, an inversion layer or an accumulation layer is formed in the semiconductor layer of the select transistor ST1, and a current can flow through the select transistor ST1 (which is in the on state). As a result, current flows through the bit line BL, the select transistor ST1, and the semiconductor layer of the memory pillar MP in contact with the select transistor ST1. Furthermore, the word line WL2 corresponding to the selected memory cell MC2 is set to a predetermined voltage (e.g., negative voltage), and the word lines WL0, WL1, WL3 to WLn corresponding to the non-selected memory cells MC are supplied with a predetermined voltage (e.g., positive voltage). As a result, the current path between the bit line BL and the source line SL flows through the variable resistance layer 31 (MR) in the selected memory cell MC2, and flows through the semiconductor layer 32 of the selector SW in the non-selected memory cells MC0, MC1, MC3 to MCn. As shown in FIG. 14, since the core portion 30 is provided in the central portion of the memory pillar MP, a current flows through the variable resistance layer 31 surrounding the core portion 30 in the selected memory cell MC. By doing so, the variable resistance layer 31 can be selected both during the read operation and during the write operation. When the operation of the variable resistance non-volatile memory according to the embodiment is compared with the operation of the three-dimensional NAND flash memory, there are advantages in which the variable resistance non-volatile memory can be operated at a lower voltage and at a higher speed and the number of times of rewrite is less restricted and the write time is shorter. The variable resistance non-volatile memory according to the embodiment is a variable resistance memory different from the three-dimensional NAND flash memory, and does not require an erasing operation.

Further, a write operation or a read operation is performed by making the select transistor ST1 in an on state and passing a current between the bit line BL and the source line SL. Accordingly, it is not necessary to select all of the memory cell strings MS, and selection can be performed in certain bit line units connected to one select gate line.

When the source line voltage is set equal to the bit line voltage for the memory cell string MS for which the write operation or the read operation is not desired, the write operation or the read operation will not be performed.

Further, unlike the three-dimensional NAND flash memory, it is not necessary to perform the erasing operation in units of the blocks BLK, and the write operation of set and reset can be performed in units of the select transistors ST1.

A word line selects the certain memory cell MC in the stacking direction (Z direction). Accordingly, the word line may be shared by the gate electrodes of the plurality of memory cells MC on the same XY plane. Further, the source line may be shared by the plurality of memory cell strings MS. In particular, the source line may be shared by the plurality of memory cell strings MS adjacent in the bit line direction.

For example, let us consider a case where the word line WL and the source line SL have a plate shape extending in the bit line direction and the word line direction. Selection of the memory cell MC is not performed unless the select transistor ST1 is in an on state and a current is passed from the bit line BL to the source line SL. Accordingly, although the word line WL and the source line SL are selected, only the memory cell MC that is in contact with the word line WL selected immediately below the selected select transistor ST1 (i.e., in the same memory string as the selected select transistor ST1) is selected.

As described above, the memory cell MC is selected by passing a current through the bit line BL. Accordingly, the sequencer 170 is configured, for example, to be able to issue a control signal to simultaneously perform a read operation and a write operation for each bit line. Further, the sequencer 170 can also issue a control signal to simultaneously perform reset write and set write for each bit line.

Timing Chart of Operation Waveform

Figure 15:
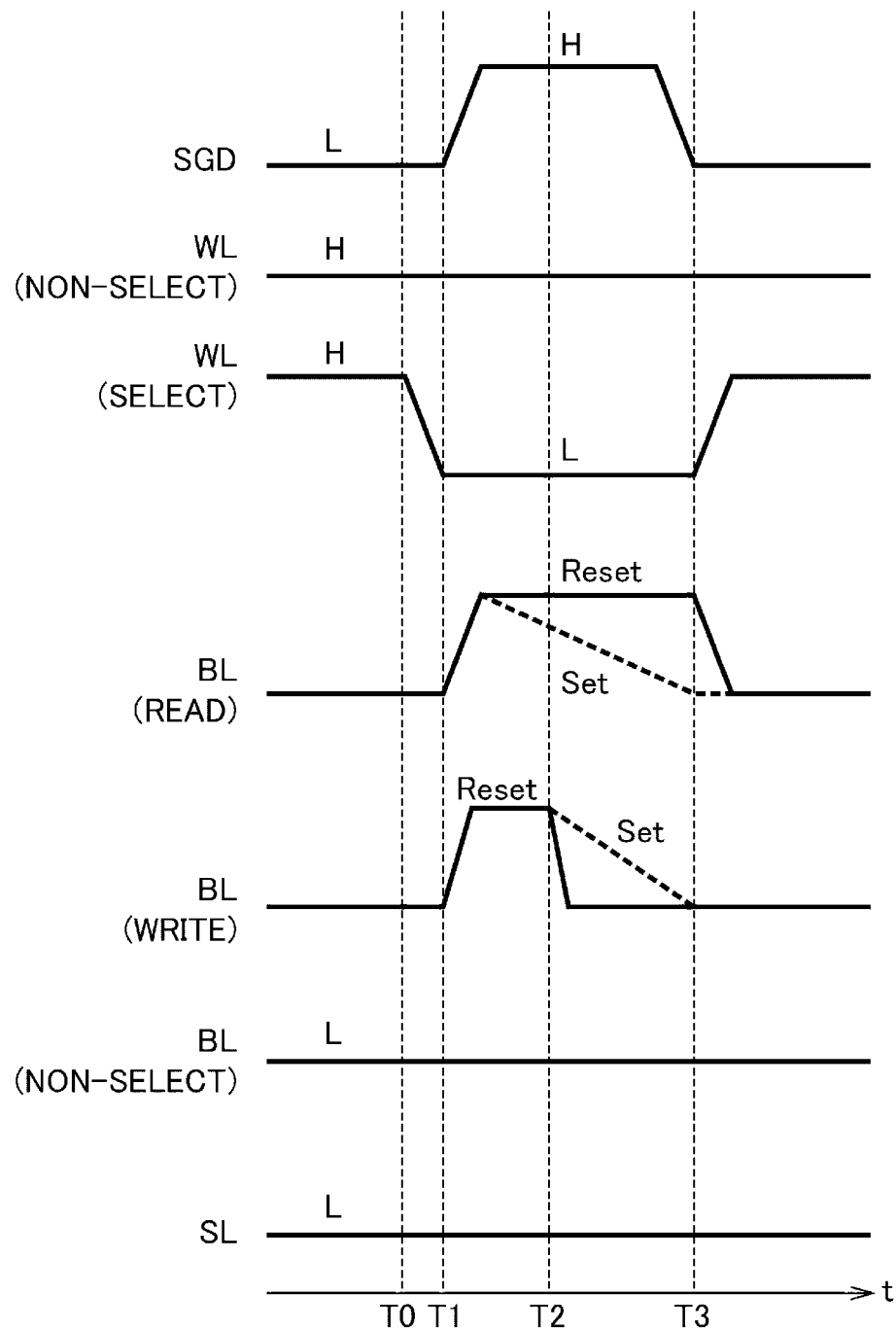
FIG. 15 is a timing chart of an operation waveform of the variable resistance non-volatile memory according to the embodiment.

FIG. 15 is a timing chart of an operation waveform of the variable resistance non-volatile memory according to the embodiment. As described above, in the memory chip 100 of the variable resistance non-volatile memory according to the embodiment, first, the voltage is applied to the word line WL such that the selector SW of the selected memory cell MC enters an OFF state and the selector SW of the non-selected memory cell MC enters an ON state. Subsequently, the memory chip 100 applies a voltage to the gate line SGD such that the select transistor corresponding to the selected memory cell MC is turned on, and the bit line BL and the memory pillar MP to which the selected memory cell belongs are in a conducting state. In this way, a current flows through the semiconductor layer 32 of the selector SW in the non-selected memory cell, and flows through the variable resistance layer 31 in the selected memory cell.

The operation waveform of the memory chip 100 of the variable resistance non-volatile memory according to the embodiment will be described with reference to FIG. 15.

Read Operation

First, a case of a read operation will be described. At time T0, the sequencer 170 maintains the voltage of the non-selected bit line BL and the source line at L level, starts lowering the selected word line WL from H level (L<H), and after time T1, maintains the voltage of the selected word line at L level.

Subsequently, the sequencer 170 raises the voltage of the gate line SGD of the select transistor corresponding to the selected memory cell MC from L level to H level. Since the voltage of the non-selected word lines WL is maintained at H level, the selector SW is maintained in the on state in the non-selected memory cells MC.

Then, the sequencer 170 raises the voltage of the selected bit line BL and then puts the bit line BL into an electrically floating state. As a result, when the selected memory cell MC is in the high resistance state (reset state), the voltage of the bit line BL drops slowly (in FIG. 15, the voltage of the bit line BL is depicted as being substantially maintained until time T3), and when the selected memory cell MC is in the low resistance state (set state), the voltage of the bit line BL drops rapidly. The sense amplifier 140 senses the "H level and L level" of the voltage of the bit line BL after a certain period of time from the application of the voltage to the bit line BL, to perform the read operation.

Write Operation

Next, a case of a write operation will be described. The operation at time T0 is the same as the read operation. During the write operation, the sequencer 170 applies a write pulse (voltage) to the bit line BL at time T1, and rapidly drops at time T2 to write a reset state with high resistance. Further, the sequencer 170 applies a write pulse (voltage) to the bit line BL at time T1, and slowly falls at time T2 to write a set state with low resistance. At this time, the non-selected bit lines BL are maintained at the same voltage as the source line SL (for example, L level). The memory cell MC is selected by the application of a voltage to the bit line BL. When the voltage of the non-selected bit line BL is raised, erroneous selection occurs, and erroneous writing occurs. A voltage may be selectively applied to the bit line BL to be read or written.

Figure 16A:
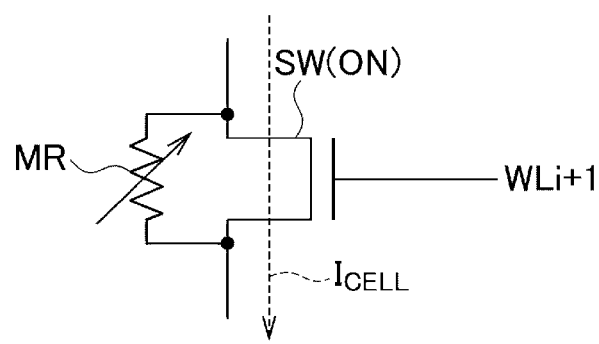
FIG. 16A is a diagram showing a current path flowing through a transistor of a non-selected cell connected to a word line in the variable resistance non-volatile memory.
Figure 16B:
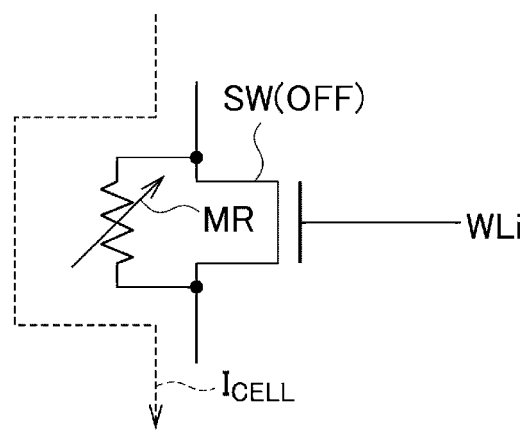
FIG. 16B is a diagram showing a current path flowing through a variable resistance element of a selected cell connected to a word line in the variable resistance non-volatile memory.

FIG. 16A is a diagram showing a current path flowing through a MOS transistor of a non-selected cell connected to a word line WLi+1 in the variable resistance non-volatile memory. FIG. 16B is a diagram showing a current path flowing through the variable resistance element MR of a selected cell connected to a word line WLi in the variable resistance non-volatile memory.

Comparative Example

Figure 17:
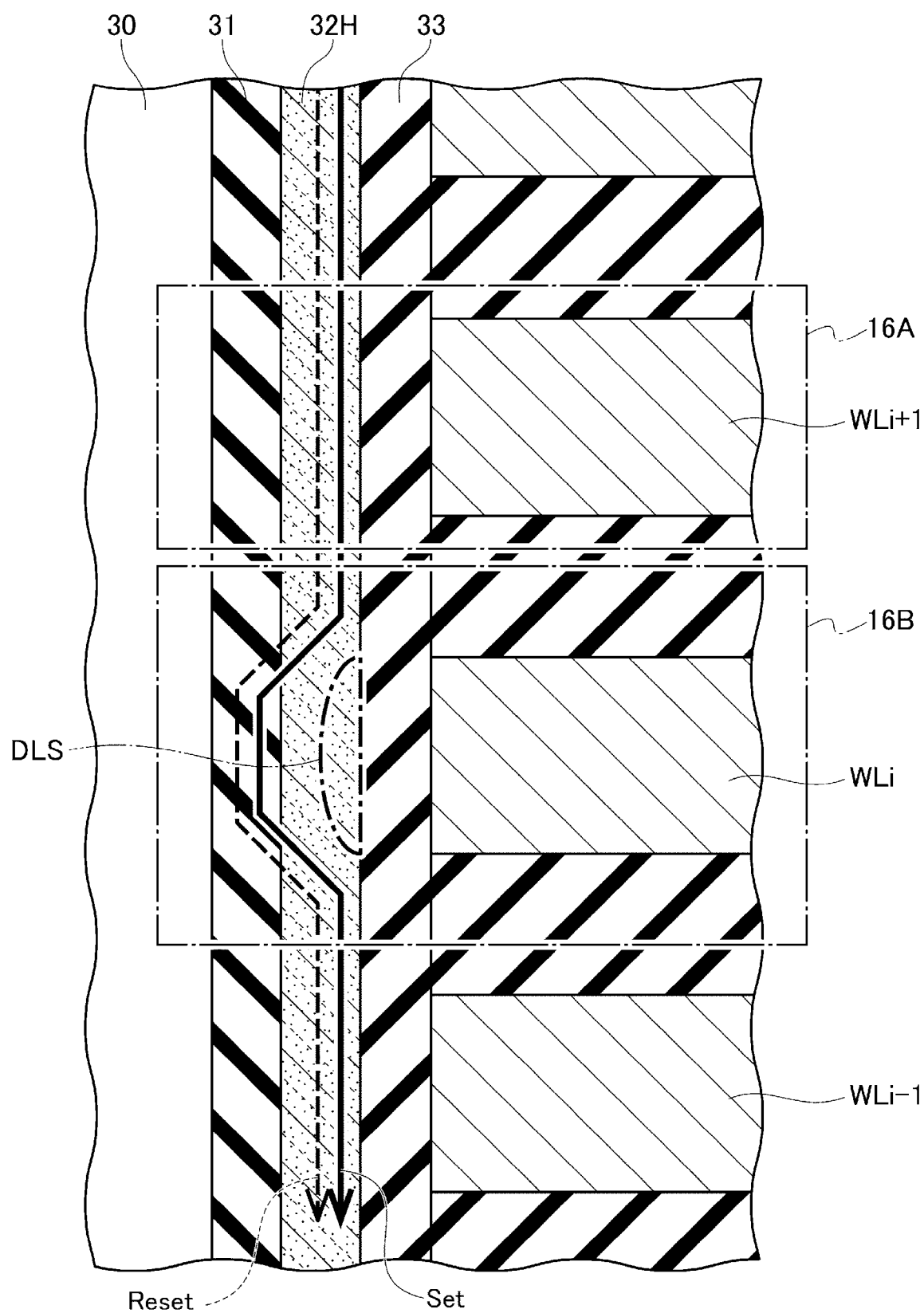
FIG. 17 is a diagram showing a state of a spread of a depletion layer in the vicinity of a selected cell connected to a selected word line, and a current in a reset state and a set state when a semiconductor layer has a high impurity concentration layer, in the variable resistance non-volatile memory according to a comparative example.

FIG. 17 is a diagram showing a state of a spread of the depletion layer DLS in the vicinity of a selected cell connected to the word line WLi, and a conduction current in a reset state and a set state when the semiconductor layer 32H has a high impurity concentration, in a variable resistance non-volatile memory according to a comparative example.

Adjacent cells connected to word line WLi+1 and word line WLi−1 are non-selected cells. In the non-selected cell represented by area 16A in FIG. 17, a current flows through the semiconductor layer 32H in both the reset state and the set state. The circuit is as shown in FIG. 16A. In the selected cell represented by area 16B in FIG. 17, a current flows through the variable resistance layer 31 in both the reset state and the set state. The circuit is as shown in FIG. 16B.

When the semiconductor layer 32H has a high impurity concentration, forming a depletion region in the semiconductor layer 32H is difficult, such that as shown in FIG. 17, the spread of the depletion layer DLS in the vicinity of the selected cell connected to the word line WLi is small in both the reset state and the set state. Consequently, the area of the variable resistance layer 31 through which the current flows is small in both the reset state and the set state. Accordingly, the value of the read current ratio is small when the semiconductor layer 32H has a high impurity concentration. Here, the read current ratio is defined as the ratio of currents that flows in the set state and the reset state. In the set state, the variable resistance layer 31 is crystallized and has high electrical conductivity. In the reset state, the variable resistance layer 31 is amorphized and has low electrical conductivity. In both the reset state and the set state, the value of the read current ratio is small because the area of the variable resistance layer 31 through which the current flows is small.

When the semiconductor layer 32H has a high impurity concentration, the depletion layer DLS that spreads in the semiconductor layer 32H when the word line WLi is selected is narrow, such that the area of the variable resistance layer 31 through current flows is small, and consequently, the read current ratio is small. From another point of view, when the semiconductor layer 32H has a high impurity concentration, the off-leakage current of the semiconductor layer 32H is large, and an extra current flows in both the set state and the reset state, such that there is also the effect of lowering the read current ratio.

When the semiconductor layer 32H has a high impurity concentration, the depletion layer DLS that spreads in the semiconductor layer 32H is narrow when the word line WLi is selected, such that the off-leakage current that flows through the non-depleted semiconductor layer 32H increases. The off-leakage current flows in parallel with the current that flows through the variable resistance layer 31, and this extra current which flows in both the set state and the reset state, causes the read current ratio to be lowered.

Figure 18:
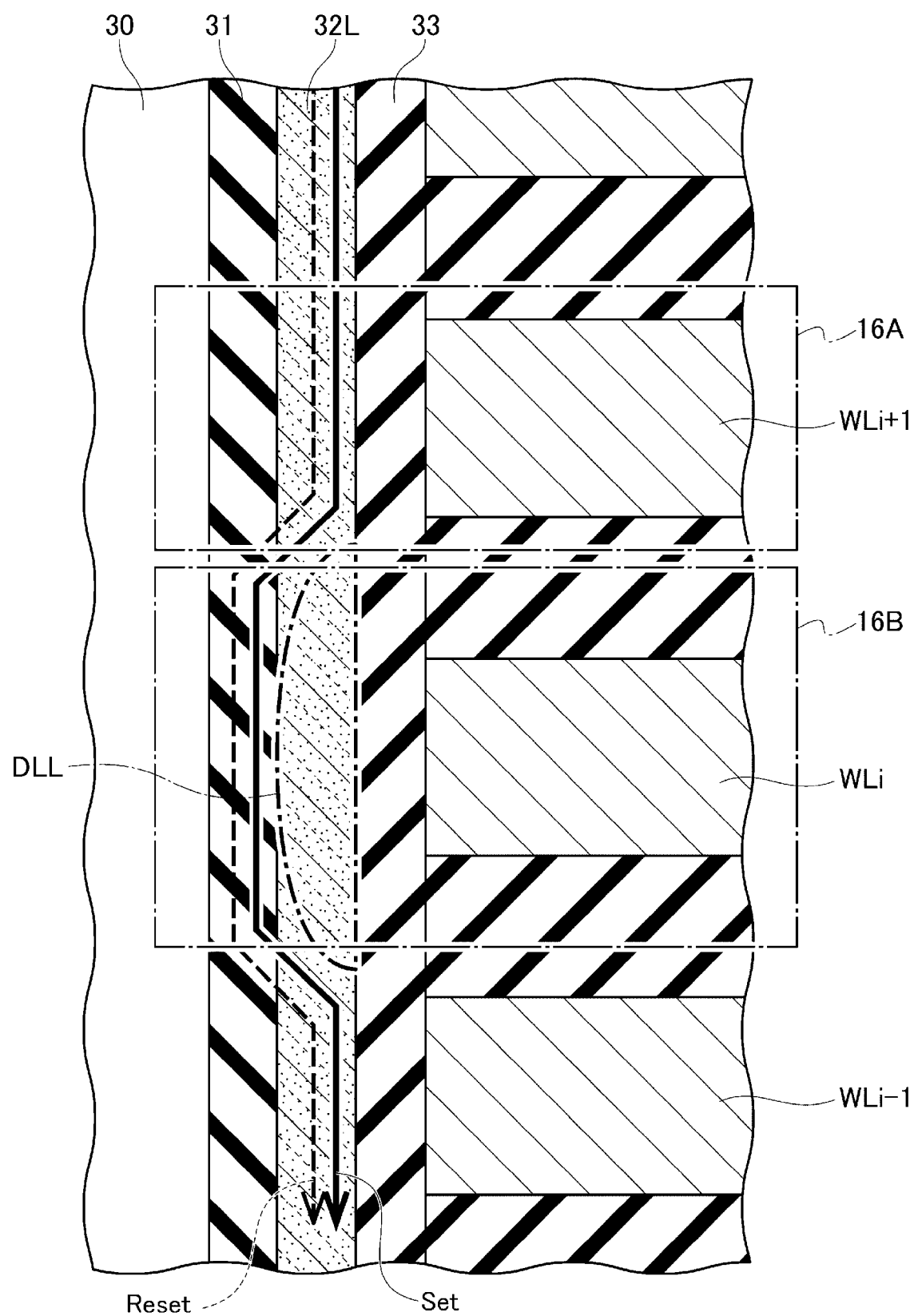
FIG. 18 is a diagram showing a state of the spread of the depletion layer in the vicinity of a selected cell connected to the selected word line, and the conduction current in the reset state and the set state when the semiconductor layer has a low impurity concentration layer, in the variable resistance non-volatile memory according to the comparative example.

FIG. 18 is a diagram showing a state of a spread of the depletion layer DLL in the vicinity of a selected cell connected to the word line WLi, and a current that flows in a reset state and a set state when the semiconductor layer 32L has a low impurity concentration, in the variable resistance non-volatile memory according to the comparative example.

Adjacent cells connected to word line WLi+1 and word line WLi−1 are non-selected cells. In the non-selected cell represented by the area 16A in FIG. 18, a current flows through the semiconductor layer 32L in both the reset state and the set state. The circuit is as shown in FIG. 16A. In the selected cell represented by the area 16B in FIG. 18, a current flows through the variable resistance layer 31 in both the reset state and the set state. The circuit is as shown in FIG. 16B.

When the semiconductor layer 32L has a low impurity concentration, forming a depletion region in the semiconductor layer 32L is easy, such that as shown in FIG. 18, the spread of the depletion layer DLL in the vicinity of the selected cell connected to the word line WLi is large in both the reset state and the set state. Consequently, the area of the variable resistance layer 31 through which current flows is large in both the reset state and the set state. Accordingly, the value of the read current ratio is large when the semiconductor layer 32L has a low impurity concentration. In the set state, the variable resistance layer 31 is crystallized and has high electrical conductivity. In the reset state, the variable resistance layer 31 is amorphized and has low electrical conductivity. In both the reset state and the set state, the value of the read current ratio is large because the area of the variable resistance layer 31 through which current flows increases. When the semiconductor layer 32L has a low impurity concentration, the resistance of an area of the semiconductor layer 32L other than the selected cell portion is increased, such that the bit line BL voltage required for writing to the variable resistance layer 31 increases.

When the semiconductor layer 32L has a low impurity concentration, the depletion layer DLL that spreads in the semiconductor layer 32L when the word line WLi is selected is wide, such that the area of the variable resistance layer 31 through which current flows increases. Consequently, the read current ratio increases. The depletion layer DLL that spreads in the semiconductor layer 32L is wide when the word line WLi is selected, such that the off-leakage current that flows through the non-depleted semiconductor layer 32H decreases. There is also the effect of improving the read current ratio in both the set state and the reset state.

When the semiconductor layer 32L has a low impurity concentration, in the selected cell, the variable resistance layer 31 with high electrical conductivity is conductive, but in areas other than the selected cell, the semiconductor layer 32L with an increased resistance is conductive, such that the bit line BL voltage required for writing to the variable resistance layer 31 increases. The bit line BL voltage is increased in order to supply the voltage required for writing to the variable resistance layer 31.

As a result, when the semiconductor layer 32L has a low impurity concentration, the read current ratio is improved, but the bit line BL voltage required for writing to the variable resistance layer 31 is increased.

Figure 19:
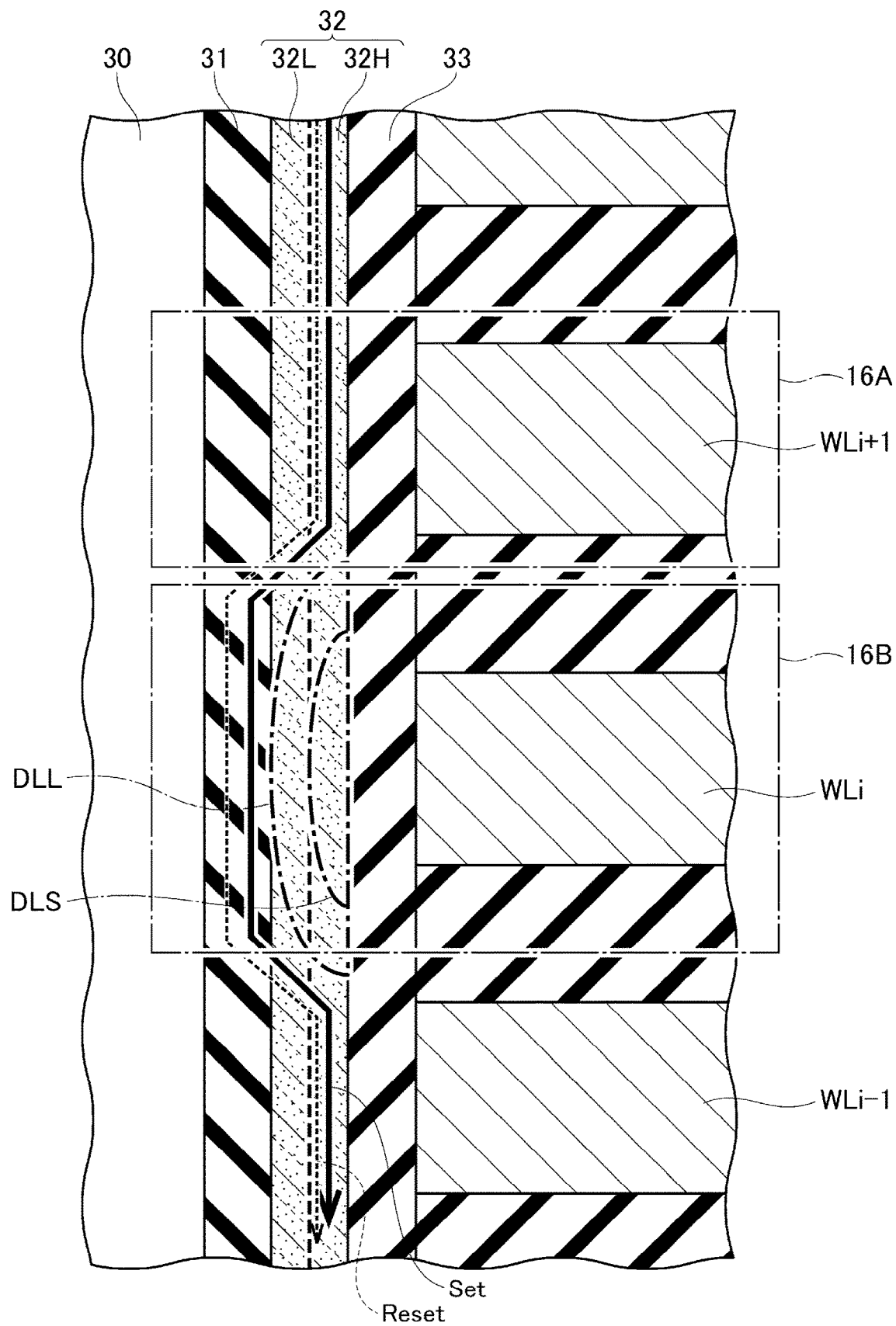
FIG. 19 is a diagram showing a state of the spread of the depletion layer in the vicinity of a selected cell connected to the selected word line, and the conduction current in the reset state and the set state, in the variable resistance non-volatile memory according to the embodiment.

FIG. 19 is a diagram showing a state of the spread of the depletion layer DLL in the vicinity of a selected cell connected to the word line WLi, and the conduction current in the reset state and the set state in the variable resistance non-volatile memory according to the embodiment.

As shown in FIG. 19, the semiconductor layer 32 includes the first semiconductor layer 32L that is in contact with the variable resistance layer 31, and the second semiconductor layer 32H that is in contact with the first semiconductor layer 32L, is in contact with the insulator layer 33, and has higher concentration impurities than the first semiconductor layer 32L. The impurity concentration of the second semiconductor layer 32H is at least ten times higher than the impurity concentration of the first semiconductor layer 32L. Further, the impurity concentration of the semiconductor layer 32 may be non-uniform, a concentration distribution may be present, and the impurity concentration of the first portion of the semiconductor layer 32 that is in contact with the insulator layer 33 may be at least ten times higher than the impurity concentration of the second portion of the semiconductor layer 32 that is in contact with the variable resistance layer 31. Here, as shown in FIG. 19, the semiconductor layer 32 will be described with an example of a two-layer structure of the first semiconductor layer 32L and the second semiconductor layer 32H.

Adjacent cells connected to word line WLi+1 and word line WLi−1 are non-selected cells. In the non-selected cell represented by the area 16A in FIG. 19, a current mainly flows through the semiconductor layer 32H in both the reset state and the set state. The circuit is as shown in FIG. 16A. In the selected cell represented by the area 16B in FIG. 19, a current flows through the variable resistance layer 31 in both the reset state and the set state. The circuit is as shown in FIG. 16B.

When the semiconductor layer 32 has a stacked structure of the semiconductor layer 32L and the semiconductor layer 32H, forming a depletion region in the semiconductor layer 32L is easy, such that as shown in FIG. 19, the spread of the depletion layer DLL in the vicinity of the selected cell connected to the word line WLi is large in both the reset state and the set state. Consequently, the area of the current that flows through the variable resistance layer 31 is large in both the reset state and the set state. Accordingly, when the semiconductor layer 32 has a stacked structure of the semiconductor layer 32L and the semiconductor layer 32H, the value of the read current ratio is large. In the set state, the variable resistance layer 31 is crystallized and has high electrical conductivity. In the reset state, the variable resistance layer 31 is amorphized and has low electrical conductivity. In both the reset state and the set state, the value of the read current ratio is large because the area of the current that flows through the variable resistance layer 31 increases. Further, FIG. 19 also shows, for comparison, the depletion layer DLS that spreads when the semiconductor layer 32 has a high impurity concentration.

When the semiconductor layer 32 has a stacked structure of the semiconductor layer 32L and the semiconductor layer 32H, the depletion layer DLL that spreads in the semiconductor layer 32L is wide when the word line WLi is selected, such that the off-leakage current that flows through the non-depleted semiconductor layer 32L decreases. There is also the effect of improving the read current ratio in both the set state and the reset state.

When the semiconductor layer 32 has a stacked structure of the semiconductor layer 32L and the semiconductor layer 32H, the resistance of an area of the semiconductor layer 32H other than the selected cell portion is lowered, such that the bit line BL voltage required for writing to the variable resistance layer 31 decreases. In the selected cell, the variable resistance layer 31 with high electrical conductivity is conductive, but in areas other than the selected cell, the semiconductor layer 32H with a lowered resistance is conductive, such that the bit line BL voltage required for writing to the variable resistance layer 31 can be low. Accordingly, in the variable resistance non-volatile memory according to the embodiment, the bit line BL voltage for supplying the voltage required for writing to the variable resistance layer 31 can be decreased. As a result, when the semiconductor layer 32 has a stacked structure of the semiconductor layer 32L and the semiconductor layer 32H, the read current ratio is improved, and the bit line BL voltage required for writing to the variable resistance layer 31 can be decreased.

Here, the concentration ratio between the semiconductor layer 32L and the semiconductor layer 32H for improving the read current ratio is preferably at least ten times. Further, as described above, the impurity concentration of the semiconductor layer 32 is non-uniform and a concentration distribution is present. The impurity concentration of the first portion of the semiconductor layer 32 that is in contact with the insulator layer 33 is at least ten times or 100 times higher than the impurity concentration of the second portion of the semiconductor layer 32 that is in contact with the variable resistance layer 31.

Suppression of Heat Generation Amount of Adjacent Cells

There is an inversely proportional relationship between the impurity concentration of the semiconductor layer and the heat generation amount. When the semiconductor layer has a low impurity concentration, the semiconductor layer of the adjacent cell has a high resistance, the heat generation amount in the variable resistance layer of the adjacent cell increases, and the temperature of the adjacent cell increases. When the semiconductor layer has a high impurity concentration, the semiconductor layer of the adjacent cell has a low resistance, such that heat generation in the variable resistance layer of the adjacent cell is suppressed to be low, and the temperature of the adjacent cell is lowered.

Figure 20:
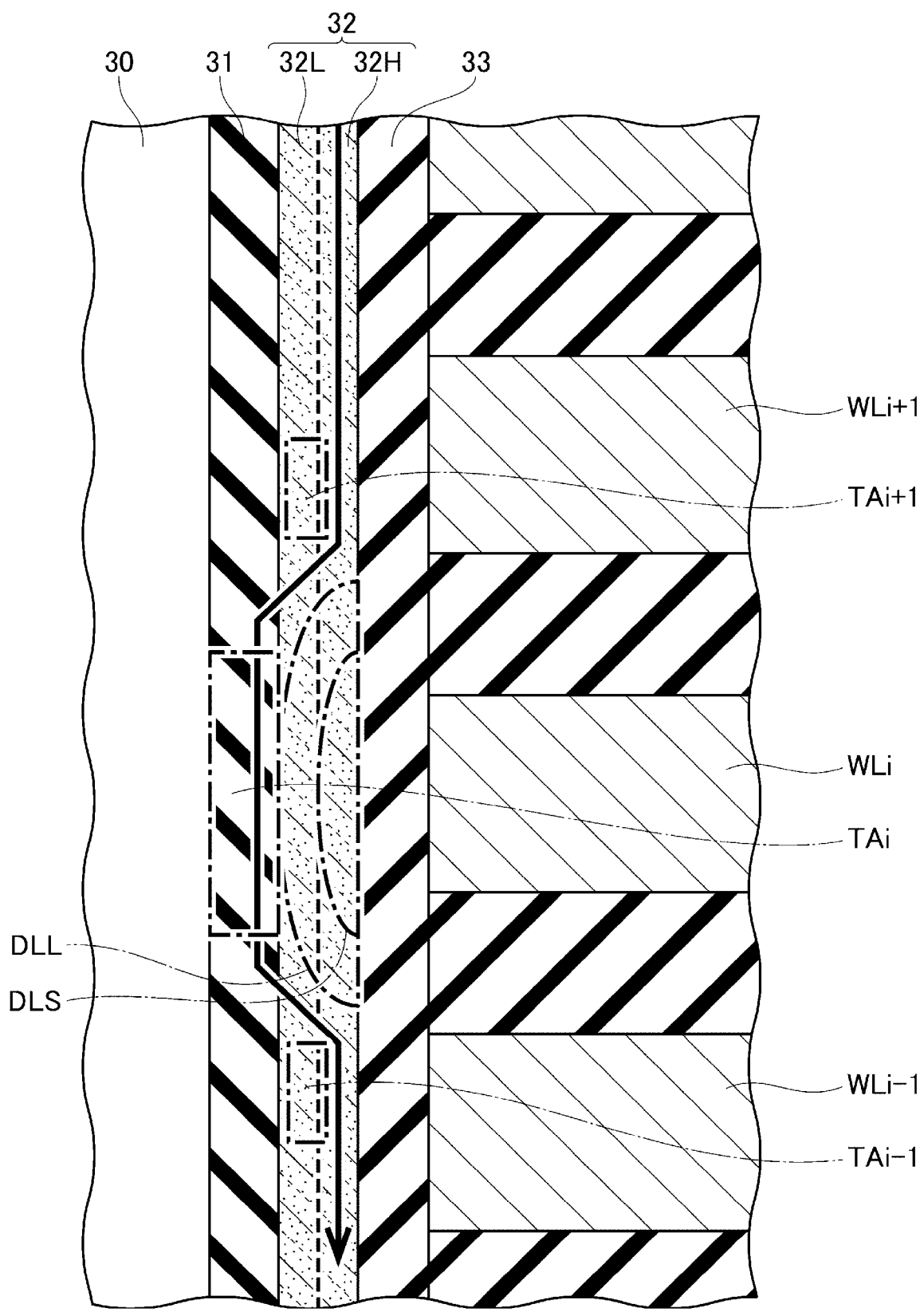
FIG. 20 is a diagram schematically showing a state of a heat generation area in a variable resistance layer in the vicinity of a selected cell connected to the selected word line and heat generation areas in a semiconductor layer in the vicinity of non-selected cells connected to adjacent word lines, in the variable resistance non-volatile memory according to the embodiment.

FIG. 20 is a diagram schematically showing a state of a heat generation area TAi in the variable resistance layer 31 in the vicinity of a selected cell connected to the word line WLi and heat generation areas TAi+1 and TAi−1 in the semiconductor layer 32 in the vicinity of non-selected cells connected to the adjacent word lines WLi+1 and WLi−1, in the variable resistance non-volatile memory according to the embodiment. The heat generation areas TAi, TAi+1, and TAi−1 are represented by rectangular shapes, but schematically represent their relative spreads. The heat generation areas TAi, TAi+1, TAi−1 are not limited to the shape depicted in FIG. 20. Other shapes such as a circular shape, an elliptical shape, and an oval shape may be possible.

When the semiconductor layer 32 has a stacked structure of the semiconductor layer 32L and the semiconductor layer 32H, the resistance of the semiconductor layer 32 of the adjacent cell is lowered by the semiconductor layer 32H. Consequently, the heat generation amount of the heat generation areas TAi+1 and TAi−1 of the stacked structure of the semiconductor layer 32L and the semiconductor layer 32H is smaller than the heat generation amount of the heat generation areas TAi+1 and TAi−1 of the structure of only the semiconductor layer 32L. As a result, the adjacent cell temperature in the variable resistance layer 31 is lower in the stacked structure of the semiconductor layer 32L and the semiconductor layer 32H than in the structure of only the semiconductor layer 32L.

Simulation

A result of analyzing the variable resistance non-volatile memory according to the embodiment by using device simulation will be described below.

Figure 21:
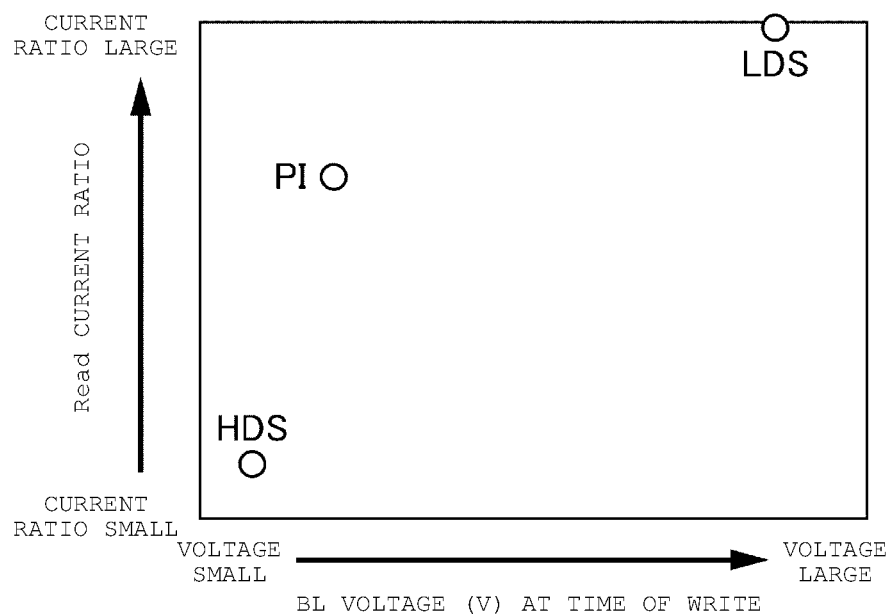
FIG. 21 shows a simulation result of a relationship between a read current ratio and a bit line voltage at the time of write in the variable resistance non-volatile memory according to the embodiment and in the variable resistance non-volatile memory according to the comparative example.

Relationship between Read Current Ratio and Bit Line BL Voltage at Time of Write FIG. 21 shows a simulation result of the relationship between the read current ratio (the ratio of the currents flowing in the set state and the reset state) and the bit line BL voltage at the time of write in the variable resistance non-volatile memory according to the embodiment. Here, PI corresponds to the variable resistance non-volatile memory according to the embodiment, HDS corresponds to a case where the semiconductor layer has a high impurity concentration as the variable resistance non-volatile memory according to the comparative example, and LDS corresponds to a case where the semiconductor layer has a low impurity concentration as the variable resistance non-volatile memory according to the comparative example.

From the simulation result of the relationship between the read current ratio and the bit line BL voltage at the time of write, it can be seen that the read current ratio and the bit line BL voltage at the time of write exhibit a trade-off relationship, as shown in FIG. 21. In the variable resistance non-volatile memory (PI) according to the embodiment, the read current ratio is improved as compared with the comparative example (HDS) in which the semiconductor layer has a high impurity concentration. Further, in the variable resistance non-volatile memory (PI) according to the embodiment, the bit line BL voltage at the time of write can be made lower than in the comparative example (LDS) in which the semiconductor layer has a low impurity concentration. In the variable resistance non-volatile memory (PI) according to the embodiment, the inner side in contact with the variable resistance layer 31 is configured with the semiconductor layer 32L having a low impurity concentration, and the outer side in contact with the first insulator layer 33 is configured with the semiconductor layer 32H having a high impurity concentration. In the variable resistance non-volatile memory (PI) according to the embodiment, it is possible to decrease the trade-off relationship between the read current ratio and the bit line BL voltage at the time of write.

Suppression of Adjacent Cell Temperature

Figure 22:
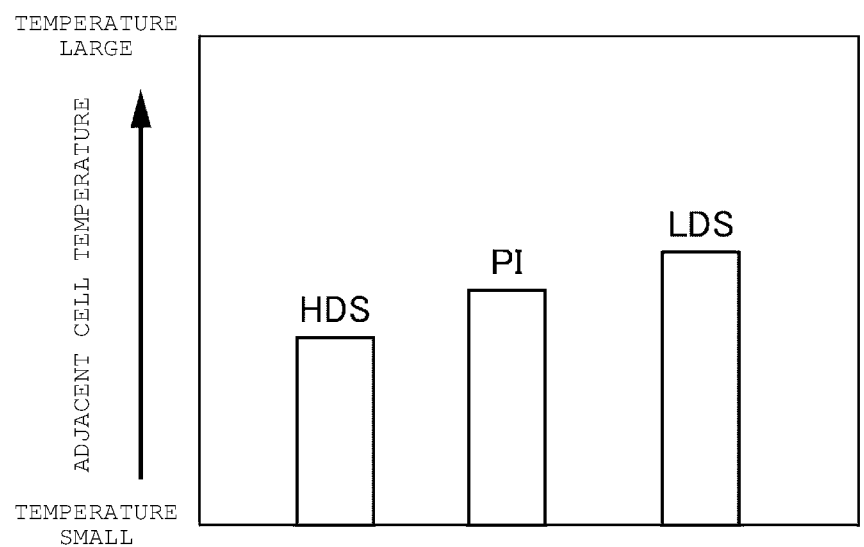
FIG. 22 shows a simulation result of adjacent cell temperatures at a specific peak temperature in the variable resistance non-volatile memory according to the embodiment and in the variable resistance non-volatile memory according to the comparative example.

FIG. 22 shows a simulation result of calculating adjacent cell temperatures at a specific peak temperature in the variable resistance non-volatile memory according to the embodiment. Here, similarly to FIG. 21, PI corresponds to the variable resistance non-volatile memory according to the embodiment, HDS corresponds to the comparative example in which the semiconductor layer has a high impurity concentration, and LDS corresponds to the comparative example in which the semiconductor layer has a low impurity concentration. When the peak temperature of a specific cell rises, the adjacent cell temperature also rises, but it is desirable to be able to suppress the extent of increase in the adjacent cell temperature although the peak temperature of the specific cell rises. In a case of the comparative example (LDS), the resistance of the semiconductor layer 32L of the adjacent cell is high and heat generation is large. Consequently, the adjacent cell temperature increases. In a case of the comparative example (HDS), the resistance of the semiconductor layer 32H of the adjacent cell is low and heat generation is small. Consequently, the adjacent cell temperature is lowered.

In the variable resistance non-volatile memory (PI) according to the embodiment, by making the semiconductor layer 32H in contact with the insulator layer 33 have a high impurity concentration, the resistance of the semiconductor layer 32H of the adjacent cell is lowered, and heat generation can be decreased. As a result, an increase in the adjacent cell temperature can be suppressed.

Impurity Concentration Distribution of Semiconductor Layer

Figure 23:
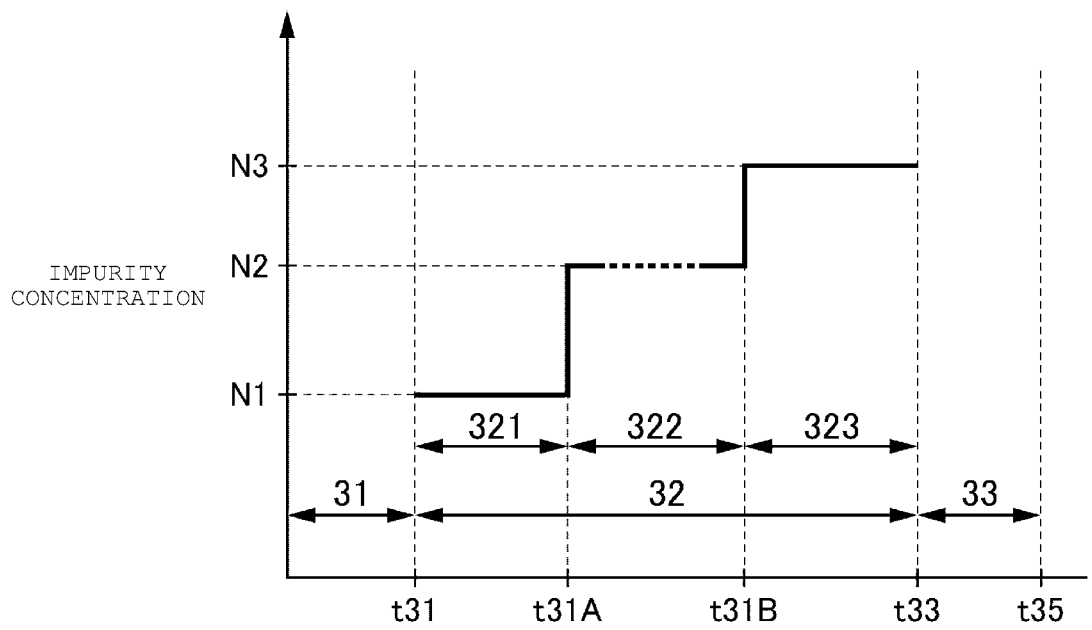
FIG. 23 is an example in which the impurity concentration of the semiconductor layer has a stepwise concentration distribution in the variable resistance non-volatile memory according to the embodiment.

FIG. 23 is an example in which the impurity concentration of the semiconductor layer 32 has a stepwise concentration distribution in the variable resistance non-volatile memory according to the embodiment. When the impurity concentration of the semiconductor layer 32 has a stepwise distribution, the number of layers with different concentrations may be two, three, or more. In the example of FIG. 23, the impurity concentration of a semiconductor layer 321 in contact with the variable resistance layer 31 is represented by N1, and the thickness thereof is represented by t31A to t31. The impurity concentration of a semiconductor layer 322 in contact with the semiconductor layer 321 is represented by N2, and the thickness thereof is represented by t31B to t31A. Furthermore, the impurity concentration of a semiconductor layer 323 in contact with the semiconductor layer 322 is represented by N3, and the thickness thereof is represented by t33 to t31B. Here, the semiconductor layer 323 is the semiconductor layer 32 in contact with the first insulator layer 33. The thickness of the first insulator layer 33 is represented by t35 to t33. When the semiconductor layer 32 is formed in a multi-step structure, the thickness of the semiconductor layer 323 with a high impurity concentration and the semiconductor layer 321 with a low impurity concentration can be adjusted after impurity diffusion by annealing.

Figure 24:
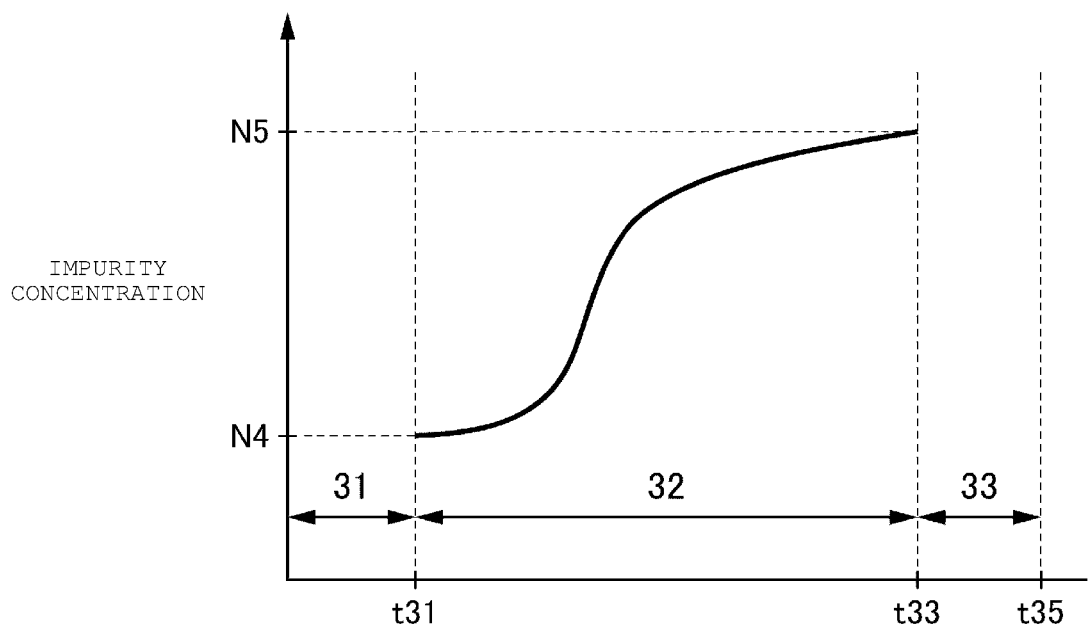
FIG. 24 is an example in which the impurity concentration of the semiconductor layer has a concentration distribution that gradually decreases from the side of a gate insulating layer toward the side of the variable resistance layer in the variable resistance non-volatile memory according to the embodiment.

FIG. 24 shows an example in which the impurity concentration of the semiconductor layer 32 has a concentration distribution that gradually decreases from the side of the first insulator layer 33 toward the side of the variable resistance layer 31 in the variable resistance non-volatile memory according to the embodiment. In the example of FIG. 24, the thickness of the semiconductor layer 32 is represented by t33 to t31. When impurity diffusion occurs, the distribution is gradual. When a semiconductor layer with a desired impurity concentration cannot be formed due to the process, a structure can be manufactured by combining semiconductor layers with conditions that allow film formation, and a semiconductor layer with a concentration close to the desired concentration can be achieved after impurity diffusion such as annealing. In the variable resistance non-volatile memory according to the embodiment, the impurity concentration of the semiconductor layer 32 may have a mix of a uniform distribution and a distribution that gradually increases and decreases.

Figure 25:
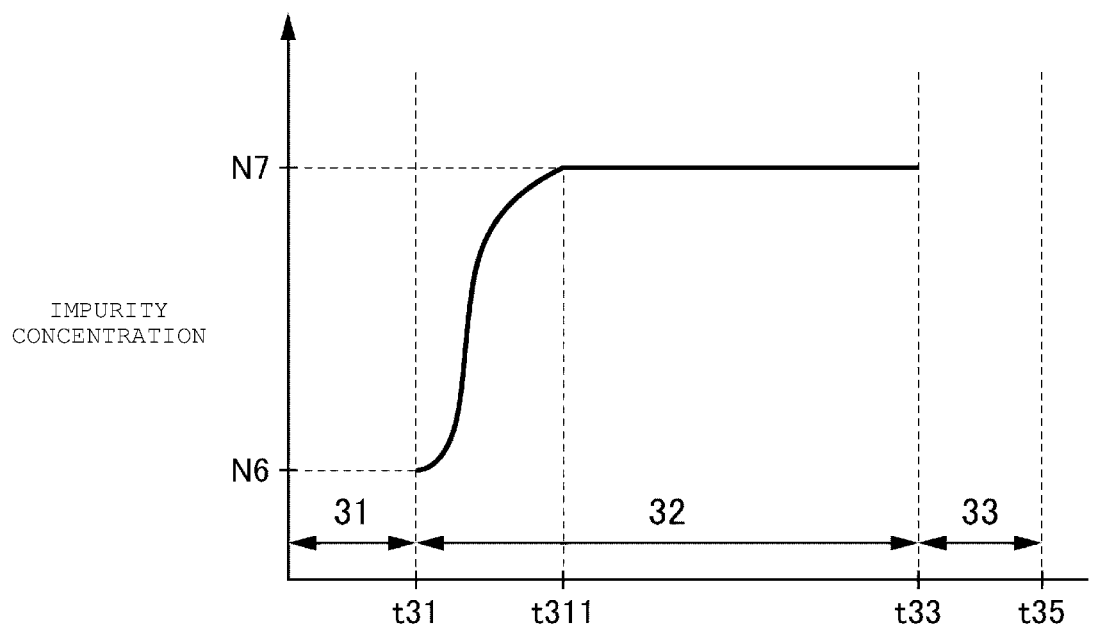
FIG. 25 is an example in which the impurity concentration of the semiconductor layer has a concentration distribution that is uniform on the side of the gate insulating layer and gradually decreases on the side of the variable resistance layer in the variable resistance non-volatile memory according to the embodiment.

FIG. 25 is an example in which the impurity concentration of the semiconductor layer 32 has a concentration distribution that is uniform on the side of the first insulator layer 33 and gradually decreases on the side of the variable resistance layer 31 in the variable resistance non-volatile memory according to the embodiment. In the example of FIG. 25, the impurity concentration of the semiconductor layer 32 in contact with the variable resistance layer 31 is represented by N6, and the impurity concentration of the semiconductor layer 32 in contact with the first insulator layer 33 is represented by N7. A concentration distribution is provided in which the impurity concentration of the semiconductor layer 32 is substantially uniform at N7 in the range of the thickness t311 to t33 of the semiconductor layer 32, and the impurity concentration of the semiconductor layer 32 gradually decreases on the side of the variable resistance layer 31 from N7 to N6 in the range of the thickness t311 to t31 of the semiconductor layer 32.

When the impurity concentration of the semiconductor layer 32 on the side of the first insulator layer 33 is desired to be as high as possible, the semiconductor layer 32 on the side of the first insulator layer 33 preferably has a high and uniform concentration. For example, it can be produced by doping the semiconductor layer 32 up to the solid solubility limit. Here, when the semiconductor layer 32 is formed of silicon, P or As may be applied as the impurity forming the N-type.

Figure 26:
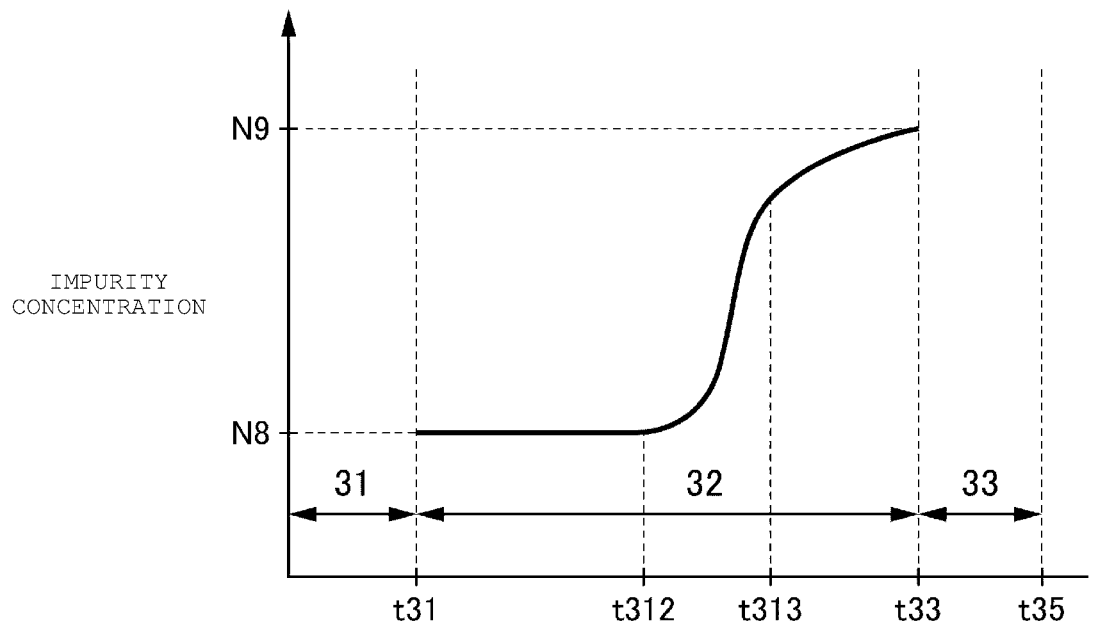
FIG. 26 is an example in which the impurity concentration of the semiconductor layer has a concentration distribution that is uniform on the side of the variable resistance layer and gradually increases on the side of the gate insulating layer in the variable resistance non-volatile memory according to the embodiment.

FIG. 26 is an example in which the impurity concentration of the semiconductor layer 32 has a concentration distribution that is substantially uniform on the side of the variable resistance layer 31 and gradually increases on the side of the first insulator layer 33 in the variable resistance non-volatile memory according to the embodiment. In the example of FIG. 26, the impurity concentration of the semiconductor layer 32 in contact with the first insulator layer 33 is represented by N9, and the impurity concentration of the semiconductor layer 32 in contact with the first insulator layer 33 is represented by N8. In the range of the thickness t31 to t33 of the semiconductor layer 32, the impurity concentration of the semiconductor layer 32 is N8, which is substantially uniform. The impurity concentration of the semiconductor layer 32 is substantially uniform within the range of the thickness t31 to t312 of the semiconductor layer 32. A concentration distribution is provided in which the impurity concentration of the semiconductor layer 32 sharply increases in the range of the thickness t312 to t313 of the semiconductor layer 32, and the impurity concentration of the semiconductor layer 32 gradually increases in the range of the thickness t313 to t33 of the semiconductor layer 32.

For example, when the concentration of the semiconductor layer 32 in the vicinity of the interface between the variable resistance layer 31 and the semiconductor layer 32 is desired to be as low as possible, the concentration on the side of the variable resistance layer 31 is preferably low and uniform. Such a structure is produced, for example, as follows. That is, the thin semiconductor layer 32 with a high concentration (N9) is formed at the interface between the semiconductor layer 32 and the first insulator layer 33 and is thermally diffused. The semiconductor layer 32 with a low concentration or being undoped is formed on the side of the variable resistance layer 31 and the semiconductor layer 32. It can be produced by performing annealing such that impurity diffusion from the semiconductor layer 32 with a high concentration (N9) stops in the vicinity of the film center of the semiconductor layer 32 (thickness t312). Further, for example, due to thermal diffusion, it is also possible to form an impurity profile in which the impurity concentration on the interface side of the semiconductor layer 32 increases due to the pile-up phenomenon (segregation) of P, As, and the like at the interface between the semiconductor layer 32 and the first insulator layer 33 ($Si/SiO_2$).

Effect of Embodiment

According to the embodiments, it is possible to provide a variable resistance non-volatile memory of a three-dimensional structure that can expand a read margin, can be driven at a low voltage and operate at high speed, and can suppress an increase in an adjacent cell temperature. Further, it is possible to improve the localization of heat generation locations and decrease thermal disturbance (to cause data destruction) to an adjacent memory cell.

In the variable resistance non-volatile memory according to the embodiment, the memory element MR of the memory cell MC may have a configuration that specifically includes, (I) in addition to the above-mentioned alloy type phase transition element ($Ge_2Sb_2Te_5$), any of (II) alternate stacking of GeTe and $Sb_2Te_3$ as an interfacial phase transition element, (III) alternate stacking of GeTe and BiSbTe as an interfacial phase transition element, (IV) alternate stacking of Ge, Sb, and Te or a chalcogenide material, (V) $TiO_x$, $WO_x$, $HfO_x$, $TaO_x$, and the like as a variable resistance film, and (VI) a CoFe alloy, a NiFe alloy, and the like as an MTJ element. Further, a material having a Ge composition ratio higher than that of $Ge_2Sb_2Te_5$ may be used. A stacked structure of $Ge_xSb_yTe_z$ having different composition ratios may be used. Further, the present disclosure is not limited to the alternate stacking described above.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:
1. A variable resistance non-volatile memory comprising a memory cell including:
 a core portion extending in a first direction above a semiconductor substrate;

a variable resistance layer extending in the first direction and in contact with the core portion;
a semiconductor layer extending in the first direction and in contact with the variable resistance layer;
a first insulator layer extending in the first direction and in contact with the semiconductor layer; and
a first voltage application electrode extending in a second direction crossing the first direction and in contact with the first insulator layer, wherein
an impurity concentration of the semiconductor layer is non-uniform, such that an impurity concentration of a first portion of the semiconductor layer in direct contact with the first insulator layer is at least ten times higher than an impurity concentration of a second portion of the semiconductor layer in direct contact with the variable resistance layer,
the second portion of the semiconductor layer is in direct contact with the variable resistance layer in a region laterally overlapping the first voltage application electrode in the second direction, and
the second portion of the semiconductor layer is between the first portion of the semiconductor layer and the variable resistance layer in a radial direction from the core portion.

2. The variable resistance non-volatile memory according to claim 1, wherein
the semiconductor layer includes a first semiconductor layer extending in the first direction and in direct contact with the variable resistance layer and a second semiconductor layer extending in the first direction, in direct contact with the first semiconductor layer, in direct contact with the first insulator layer, and having a higher concentration of impurities than the first semiconductor layer, and
an impurity concentration of the second semiconductor layer is at least ten times higher than an impurity concentration of the first semiconductor layer.

3. The variable resistance non-volatile memory according to claim 2, wherein the impurity concentration of the first semiconductor layer does not vary in accordance with a distance from the variable resistance layer and the impurity concentration of the second semiconductor layer does not vary in accordance with a distance from the first insulator layer.

4. The variable resistance non-volatile memory according to claim 2, wherein the impurity concentration of the first semiconductor layer does not vary in accordance with a distance from the variable resistance layer and the impurity concentration of the second semiconductor layer varies in accordance with a distance from the first insulator layer.

5. The variable resistance non-volatile memory according to claim 2, wherein the impurity concentration of the first semiconductor layer varies in accordance with a distance from the variable resistance layer and the impurity concentration of the second semiconductor layer does not vary in accordance with a distance from the first insulator layer.

6. The variable resistance non-volatile memory according to claim 1, wherein
the impurity concentration of the semiconductor layer varies in accordance with a distance from the first insulator layer.

7. The variable resistance non-volatile memory according to claim 1, wherein the impurity concentration of the semiconductor layer varies in a stepwise manner with respect to the distance from the first insulator layer.

8. The variable resistance non-volatile memory according to claim 1, further comprising:
a first select transistor including
the semiconductor layer extending in the first direction,
the first insulator layer extending in the first direction and in contact with the semiconductor layer, and
a second voltage application electrode extending in the second direction and in contact with the first insulator layer; and
a memory cell string including
the first select transistor, and
a plurality of the memory cells, wherein
the plurality of memory cells are connected in series in the first direction and include a first memory cell at a first end thereof and a second memory cell at a second end thereof, and one end of the first select transistor is connected to one end of the first memory cell and a third voltage application electrode is connected to one end of the second memory cell.

9. The variable resistance non-volatile memory according to claim 1, wherein
the variable resistance layer is formed of a phase change material, a superlattice film material, a magnetic material, or a variable resistance material.

10. The variable resistance non-volatile memory according to claim 9, wherein:
the phase change material includes a chalcogenide-based material;
the superlattice film material includes a stack structure of GeTe and SbTe;
the magnetic material includes a tunnel film interposed between a free layer and a pin layer; and
the variable resistance material includes at least one material selected from the group consisting of $NiO_x$, $WO_x$, $TaO_x$, $TiO_x$, $HfO_x$, $ZnO_x$, TiON, Ag—GeSe, Cu—GeSe, $FeO_x$, $GeO_x$, and STO.

11. A variable resistance non-volatile memory, comprising a memory cell including:
a core portion extending in a first direction above a semiconductor substrate;
a variable resistance layer in a cylindrical shape extending in the first direction and covering an outer periphery of the core portion;
a semiconductor layer extending in the first direction and covering an outer periphery of the variable resistance layer;
a first insulator layer extending in the first direction and covering an outer periphery of the semiconductor layer; and
a first voltage application electrode extending in a second direction crossing the first direction and covering a portion of an outer periphery of the first insulator layer, wherein
an impurity concentration of the semiconductor layer is non-uniform, such that an impurity concentration of a first portion of the semiconductor layer in direct contact with the first insulator layer is at least ten times higher than an impurity concentration of a second portion of the semiconductor layer in direct contact with the variable resistance layer,
the second portion of the semiconductor layer is in direct contact with the variable resistance layer in a region laterally overlapping the first voltage application electrode in the second direction, and
the second portion of the semiconductor layer is between the first portion of the semiconductor layer and the variable resistance layer in a radial direction from the core portion.

12. The variable resistance non-volatile memory according to claim 11, wherein
the semiconductor layer includes a first semiconductor layer extending in the first direction and in direct contact with the variable resistance layer, and a second semiconductor layer extending in the first direction, in direct contact with the first semiconductor layer, in direct contact with the first insulator layer, and having a higher concentration of impurities than the first semiconductor layer, and
an impurity concentration of the second semiconductor layer is at least ten times higher than an impurity concentration of the first semiconductor layer.

13. The variable resistance non-volatile memory according to claim 12, wherein
the impurity concentration of at least one of the first semiconductor layer and the second semiconductor layer is uniform.

14. The variable resistance non-volatile memory according to claim 11, further comprising:
a first select transistor including
a semiconductor layer having a columnar shape or a cylindrical shape extending in the first direction,
an insulator layer extending in the first direction and covering an outer periphery of the semiconductor layer, and
a second voltage application electrode extending in the second direction and covering an outer periphery of the insulator layer; and
a memory cell string including
the first select transistor and
a plurality of the memory cells, wherein
the plurality of memory cells are connected in series in the first direction, one end of the first select transistor is connected to one end of the first memory cell, and a third voltage application electrode is connected to one end of the second memory cell.

15. The variable resistance non-volatile memory according to claim 14, further comprising:
a fourth voltage application electrode connected to the other end of the first select transistor and extending in a third direction crossing the first direction and the second direction; and
a sequencer configured to perform a read operation or a write operation by applying a first voltage to the fourth voltage application electrode and a second voltage lower than the first voltage to the third voltage application electrode.

16. The variable resistance non-volatile memory according to claim 11, wherein
the core portion is formed by one of an insulator with high thermal resistance, vacuum, and an inert gas.

17. The variable resistance non-volatile memory according to claim 16, wherein
the core portion is formed by one of low vacuum, medium vacuum, high vacuum, and ultra high vacuum.

18. The variable resistance non-volatile memory according to claim 16, wherein
the inert gas includes rare gas or nitrogen gas.

19. The variable resistance non-volatile memory according to claim 11, wherein
the variable resistance layer is formed of a phase change material, a superlattice film material, a magnetic material, or a variable resistance material.

20. The variable resistance non-volatile memory according to claim 19, wherein:
the phase change material includes a chalcogenide-based material;
the superlattice film material includes a stack structure of GeTe and SbTe;
the magnetic material includes a tunnel film interposed between a free layer and a pin layer; and
the variable resistance material includes at least one material selected from the group consisting of $NiO_x$, $WO_x$, $TaO_x$, $TiO_x$, $HfO_x$, $ZnO_x$, TiON, Ag—GeSe, Cu—GeSe, $FeO_x$, $GeO_x$, and STO.

* * * * *